US008741777B2

(12) United States Patent
Shimoi et al.

(10) Patent No.: US 8,741,777 B2
(45) Date of Patent: Jun. 3, 2014

(54) SUBSTRATE PROCESSING METHOD

(75) Inventors: Hideki Shimoi, Hamamatsu (JP);
Keisuke Araki, Hamamatsu (JP)

(73) Assignee: Hamamatsu Photonics K.K.,
Hamamatsu-shi, Shizuoka (JP)

( * ) Notice: Subject to any disclaimer, the term of this patent is extended or adjusted under 35 U.S.C. 154(b) by 0 days.

(21) Appl. No.: 13/389,288

(22) PCT Filed: Jul. 19, 2011

(86) PCT No.: PCT/JP2011/066361
§ 371 (c)(1),
(2), (4) Date: Feb. 7, 2012

(87) PCT Pub. No.: WO2012/014724
PCT Pub. Date: Feb. 2, 2012

(65) Prior Publication Data
US 2012/0135608 A1 May 31, 2012

(30) Foreign Application Priority Data
Jul. 26, 2010 (JP) .................................. 2010-167430

(51) Int. Cl.
*H01L 21/302* (2006.01)
(52) U.S. Cl.
USPC ............. 438/705; 438/753; 438/795; 216/87; 216/99; 257/E21.328; 257/E21.347
(58) Field of Classification Search
None
See application file for complete search history.

(56) References Cited

U.S. PATENT DOCUMENTS

| 6,992,026 | B2 | 1/2006 | Fukuyo et al. |
| 7,033,519 | B2 | 4/2006 | Taylor et al. |
| 2005/0181581 | A1* | 8/2005 | Fukuyo et al. ................ 438/463 |
| 2005/0272223 | A1 | 12/2005 | Fujii et al. |
| 2009/0065481 | A1* | 3/2009 | Kishimoto et al. ............ 216/87 |
| 2010/0136766 | A1 | 6/2010 | Sakamoto et al. |

FOREIGN PATENT DOCUMENTS

| JP | 4-150212 | 5/1992 |
| JP | 7-40482 | 5/1995 |
| JP | 10-202878 | 8/1998 |
| JP | 2873937 | 1/1999 |

(Continued)

OTHER PUBLICATIONS

Andrius Marcinkevičius, et al., "Femtosecond laser-assisted three-dimensional microfabrication in silica", Mar. 1, 2001, Optics Letters, vol. 26, No. 5, p. 277-279.

*Primary Examiner* — Lan Vinh
*Assistant Examiner* — Jiong-Ping Lu
(74) *Attorney, Agent, or Firm* — Drinker Biddle & Reath LLP

(57) ABSTRACT

A substrate processing method for forming a space extending along a predetermined line in a silicon substrate includes a first step of converging a laser light which is an elliptically-polarized light having an ellipticity other than 1 at the substrate so as to form a plurality of modified spots within the substrate along the line and construct a modified region including the modified spots, and a second step of anisotropically etching the substrate so as to advance an etching selectively along the modified region and form the space in the substrate. In the first step, the light is converged at the substrate such that a moving direction of the light with respect to the substrate and a direction of polarization of the light form an angle of less than 45° therebetween, and the modified spots are made align in a plurality of rows along the line.

7 Claims, 26 Drawing Sheets

(56) References Cited

FOREIGN PATENT DOCUMENTS

| | | |
|---|---|---|
| JP | 2000-246475 | 9/2000 |
| JP | 2002-210730 | 7/2002 |
| JP | 2004-128445 | 4/2004 |
| JP | 2004-136358 | 5/2004 |
| JP | 2004-160618 | 6/2004 |
| JP | 2004-223586 | 8/2004 |
| JP | 2004-304130 | 10/2004 |
| JP | 2004-351494 | 12/2004 |
| JP | 2004-359475 | 12/2004 |
| JP | 2005-1211 | 1/2005 |
| JP | 2005-74663 | 3/2005 |
| JP | 2005-121915 | 5/2005 |
| JP | 2005-121916 | 5/2005 |
| JP | 2005-144586 | 6/2005 |
| JP | 2005-144622 | 6/2005 |
| JP | 2005-152693 | 6/2005 |
| JP | 2005-169993 | 6/2005 |
| JP | 2005-206401 | 8/2005 |
| JP | 2005-208175 | 8/2005 |
| JP | 2005-306702 | 11/2005 |
| JP | 2005-351774 | 12/2005 |
| JP | 2006-167804 | 6/2006 |
| JP | 2006-176355 | 7/2006 |
| JP | 2006-290630 | 10/2006 |
| JP | 2006-352171 | 12/2006 |
| JP | 2007-36758 | 2/2007 |
| JP | 2007-61855 | 3/2007 |
| JP | 2007-101833 | 4/2007 |
| JP | 2008-173693 | 7/2008 |
| JP | 2010-155259 | 7/2010 |
| WO | 00/50198 | 8/2000 |

* cited by examiner (a)

(b)

(a)

(b)

(a)

(b)

(a)

(b)

(a)

(b)

(a)

(b)

(a)

(b)

(a)

(b)

(a)

(b)

SUBSTRATE PROCESSING METHOD

TECHNICAL FIELD

The present invention relates to a substrate processing method for forming a space such as a through hole in a silicon substrate.

BACKGROUND ART

As an example of substrate processing methods in the above-mentioned technical field, Patent Literature 1 discloses one comprising converging a laser light at a silicon substrate so as to form a modified region and then etching the silicon substrate so as to advance an etching selectively along the modified region, thereby forming a space such as a through hole in the silicon substrate.

CITATION LIST

Patent Literature

Patent Literature 1: Japanese Patent Application Laid-Open No. 2005-74663

SUMMARY OF INVENTION

Technical Problem

While substrate processing methods such as the one mentioned above have been advancing their application to a variety of fields, it has become necessary for them to accurately form spaces having various shapes such as through holes extending in a direction tilted with respect to a thickness direction of the silicon substrate (which may simply be referred to as "tilted direction" hereinafter) in a silicon substrate in order to improve the degree of freedom in designing, for example.

It is therefore an object of the present invention to provide a substrate processing method which can accurately form spaces having various shapes in a silicon substrate.

Solution to Problem

The substrate processing method in accordance with one aspect of the present invention is a substrate processing method for forming a space extending along a predetermined line in a silicon substrate, the method comprising a first step of converging a laser light which is an elliptically-polarized light having an ellipticity other than 1 at the silicon substrate so as to form a plurality of modified spots within the silicon substrate along the line and construct a modified region including the plurality of modified spots; and a second step of anisotropically etching the silicon substrate after the first step so as to advance an etching selectively along the modified region and form the space in the silicon substrate; wherein, in the first step, the laser light is converged at the silicon substrate such that a moving direction of the laser light with respect to the silicon substrate and a direction of polarization of the laser light form an angle of less than 45° therebetween, and the plurality of modified spots are made align in a plurality of rows along the line.

When forming modified spots, in this substrate processing method, the laser light is converged at the silicon substrate such that the angle formed between the moving direction of the laser light and the direction of polarization of the laser light is less than 45°. The inventors conducted diligent studies and, as a result, have found that fractures can extend more from the modified spots into the moving direction of the laser light when converging the laser light such that the above-mentioned angle becomes less than 45° than when the angle is 45° or greater. As a consequence, in the case of forming a plurality of modified spots aligning in a plurality of rows along a predetermined line, when forming a plurality of modified spots on one of the adjacent rows and then on the other, fractures extending from the existing modified spots on the one row are less likely to inhibit the laser light from converging even if the line extends in a tilted direction, whereby a plurality of modified spots are formed reliably. Therefore, when the silicon substrate is anisotropically etched, the etching reliably advances along the modified region. Hence, this substrate processing method can accurately form spaces having various shapes in the silicon substrate.

The ellipticity of the elliptically-polarized light is (half the length of the minor axis)/(half the length of the major axis) in the ellipse representing the elliptically-polarized light. Therefore, an elliptically-polarized light with an ellipticity of 1 corresponds to a circularly-polarized light, while an elliptically-polarized light with an ellipticity of 0 (zero) corresponds to a linearly-polarized light. The direction of polarization of the laser light is the direction of the major axis of the ellipse representing the elliptically-polarized light. Hence, when the ellipticity is 0, the direction of polarization of the laser light is the direction of a line representing the linearly-polarized light.

Here, in the first step, the plurality of modified spots may be formed to align in a plurality of rows along the line when seen in a predetermined direction perpendicular to an incident direction of the laser light with respect to the silicon substrate. This can form the space with a desirable cross-sectional form when seen in the predetermined direction.

In the first step, the plurality of modified spots may be formed to align in a plurality of rows along the line when seen in an incident direction of the laser light with respect to the silicon substrate. This can form the space with a desirable cross-sectional form when seen in the incident direction.

In the first step, the laser light may be converged at the silicon substrate such that the moving direction of the laser light and the direction of polarization of the laser light form an angle of 0° therebetween. This can accurately extend fractures from the modified spots into the moving direction of the laser light, since the fractures are more restrained from extending in directions other than the moving direction of the laser light as the angle formed between the moving direction of the laser light and the direction of polarization of the laser light is closer to 0°.

The elliptically-polarized light may be a linearly-polarized light having an ellipticity of 0. This can accurately extend fractures from the modified spots into the moving direction of the laser light, since the fractures are more restrained from extending in directions other than the moving direction of the laser light as the ellipticity of the elliptically-polarized light is smaller.

There is a case where the space is a through hole opening to front and rear faces of the silicon substrate. In this case, even when the predetermined line extends in a tilted direction, the silicon substrate can accurately be formed with a through hole along such a line as mentioned above.

Advantageous Effects of Invention

The present invention can accurately form spaces having various shapes in a silicon substrate.

DESCRIPTION OF EMBODIMENTS

Figure 1:
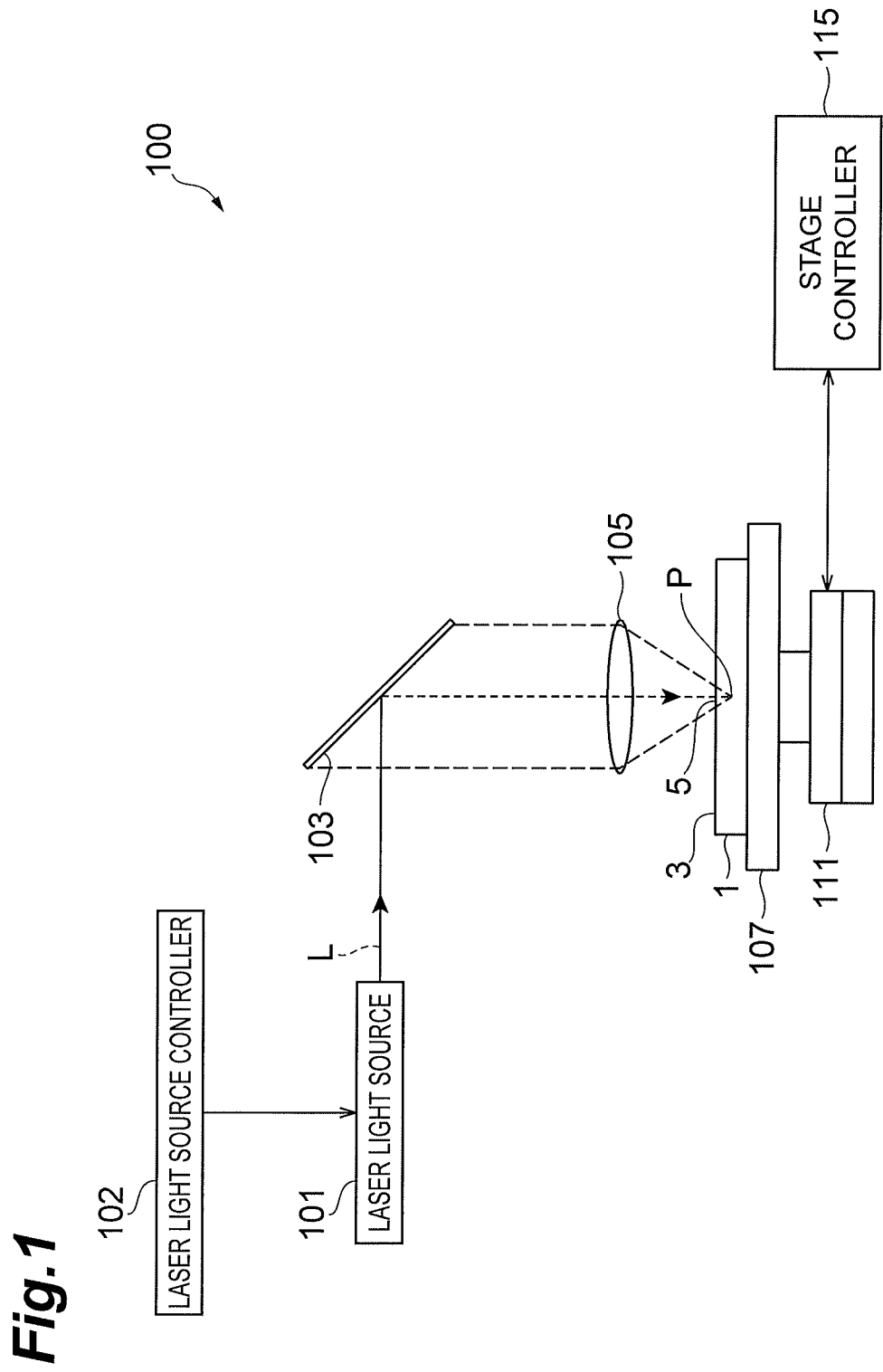
FIG. 1 is a schematic structural diagram of a laser processing device used for forming a modified region.

In the following, preferred embodiments of the present invention will be explained in detail with reference to the drawings. In the drawings, the same or equivalent parts will be referred to with the same signs while omitting their overlapping descriptions.

The substrate processing method in accordance with an embodiment converges a laser light into an object to be processed, so as to form a modified region. Therefore, the forming of the modified region will firstly be explained in the following with reference to FIGS. 1 to 6.

As illustrated in FIG. 1, a laser processing device 100 comprises a laser light source 101 which causes a laser light L to oscillate in a pulsating manner, a dichroic mirror 103 arranged such as to change the direction of the optical axis (optical path) of the laser light L by 90°, and a condenser lens 105 for converging the laser light L. The laser processing device 100 also comprises a support table 107 for supporting an object 1 to be processed irradiated with the laser light L converged by the condenser lens 105, a stage 111 for moving the support table 107, a laser light source controller 102 for controlling the laser light source 101 in order to regulate the output, pulse width, and the like of the laser light L, and a stage controller 115 for controlling the movement of the stage 111.

In the laser processing device 100, the laser light L emitted from the laser light source 101 changes the direction of its optical axis by 90° with the dichroic mirror 103 and then is converged by the condenser lens 105 into the object 1 mounted on the support table 107. At the same time, the stage 111 is shifted, so that the object 1 moves relative to the laser light L along a line 5 along which a modified region is formed. This forms a modified region in the object 1 along the line 5.

Figure 2:
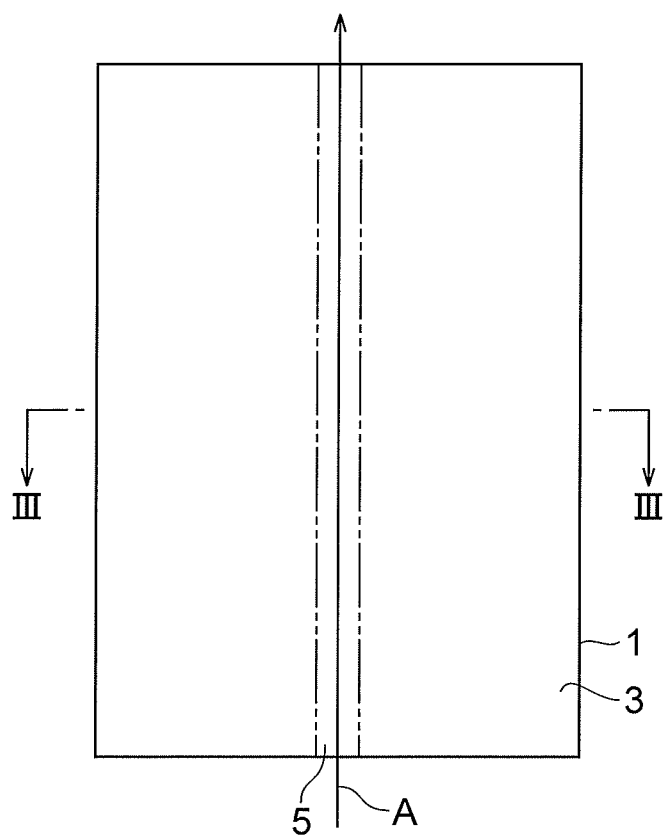
FIG. 2 is a plan view of an object to be processed in which the modified region is to be formed.
Figure 3:
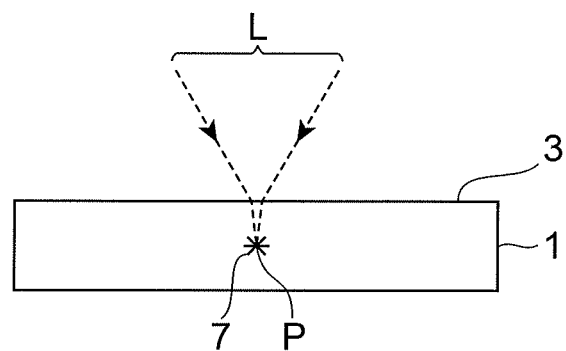
FIG. 3 is a sectional view of the object taken along the line III-III of FIG. 2.
Figure 4:
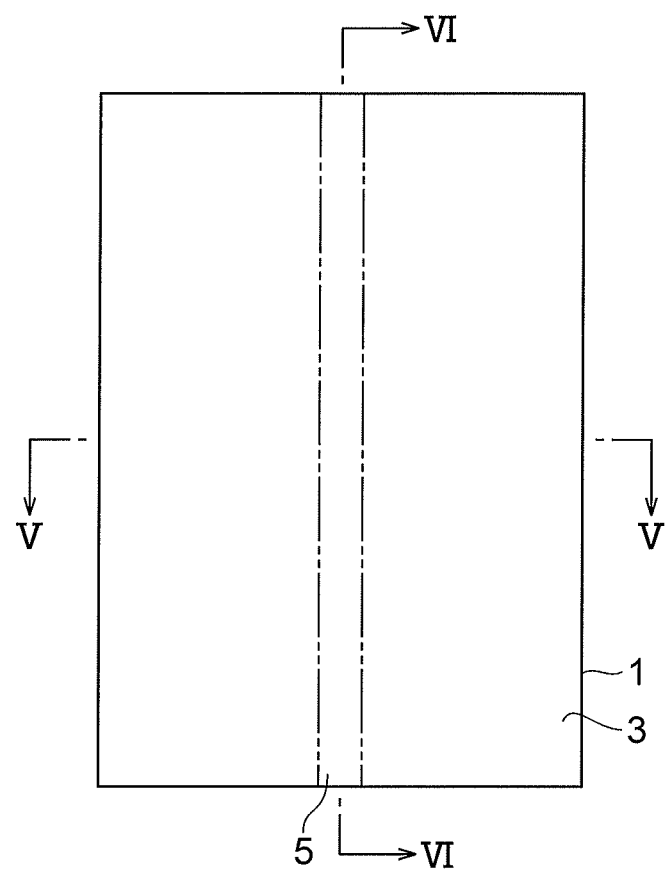
FIG. 4 is a plan view of the object after laser processing.
Figure 5:
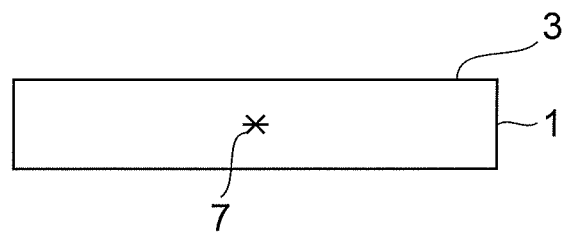
FIG. 5 is a sectional view of the object taken along the line V-V of FIG. 4.
Figure 6:
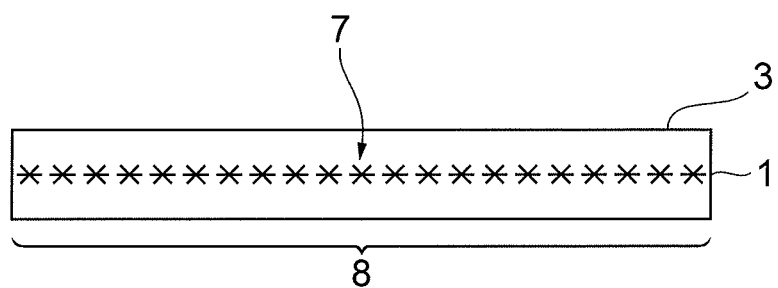
FIG. 6 is a sectional view of the object taken along the line VI-VI of FIG. 4.

As illustrated in FIG. 2, the line 5 is set in the object 1, for which a semiconductor material, a piezoelectric material, or the like is used. Here, the line 5 is a virtual line extending straight. When forming a modified region within the object 1, the laser light L is relatively moved along the line 5 (i.e., in the direction of arrow A in FIG. 2) while locating a converging point P within the object 1 as illustrated in FIG. 3. This forms a modified region 7 within the object 1 along the line 5 as illustrated in FIGS. 4 to 6, whereby the modified region 7 becomes a removing region 8 to be removed by etching which will be explained later.

The converging point P is a position at which the laser light L is converged. The line 5 may be curved instead of being straight, shaped into a three-dimensional form combining them, or specified in terms of coordinates. The modified region 7 may be formed either continuously or intermittently. The modified region 7 may be formed like lines or dots. It will be sufficient if the modified region 7 is formed at least within the object 1. There are cases where fractures are formed from the modified region 7 acting as a start point, and the fractures and modified region 7 may be exposed at outer surfaces (the front face, rear face, and side faces) of the object 1.

Here, the laser light L is absorbed in particular in the vicinity of the converging point within the object 1 while being transmitted therethrough, whereby the modified region 7 is formed in the object 1 (i.e., internal absorption type laser processing). In the case of forming a removing part such as a hole or groove by melting it away from the front face 3

(surface absorption type laser processing), the processing region gradually progresses from the front face 3 side to the rear face side in general.

The modified region 7 in accordance with this embodiment means regions whose physical characteristics such as density, refractive index, and mechanical strength have attained states different from those of their surroundings. Examples of the modified region 7 include molten processed regions, crack regions, dielectric breakdown regions, refractive index changed regions, and their mixed regions. Further examples of the modified region 7 include an area where the density has changed from that of an unmodified region in a material of the object 1 and an area formed with a lattice defect (which may collectively be referred to as a high-density transitional region).

The molten processed regions, refractive index changed regions, areas where the modified region has a density different from that of the unmodified region, or areas formed with a lattice defect may further incorporate a fracture (cut or microcrack) therewithin or at an interface between the modified region 7 and an unmodified region. The incorporated fracture may be formed over the whole surface of the modified region 7 or in only a part or a plurality of parts thereof. Examples of the object 1 include those containing or constituted by silicon.

Here, this embodiment forms the modified region 7 in the object 1 and then etches the object 1, so as to advance an etching selectively along the modified region 7 (i.e., along the modified region 7, fractures included in the modified region 7, or fractures from the modified region 7), thereby removing a part extending along the modified region 7 in the object 1. These fractures are also known as cracks, microcracks, cuts, and the like (hereinafter simply referred to as "fractures").

In the etching in this embodiment, for example, a capillary action or the like is utilized so that fractures included in the modified region 7 of the object 1 or fractures from the modified region 7 are impregnated with an etchant, so as to advance the etching along fracture surfaces. This advances the etching selectively at a higher etching rate (etching speed) along the fractures in the object 1 and removes them. Also, by utilizing the characteristic feature that the etching rate of the modified region 7 itself is high, the etching is selectively advanced along the modified region 7, so as to remove it.

Examples of the etching include a case where the object 1 is immersed in the etchant (dipping) and a case where the object 1 is coated with the etchant while being rotated (spin etching).

Examples of the etchant include KOH (potassium hydroxide), TMAH (aqueous tetramethylammonium hydroxide solution), EDP (ethylenediamine pyrocatechol), NaOH (sodium hydroxide), CsOH (cesium hydroxide), NH$_4$OH (ammonium hydroxide), and hydrazine. The etchant to be used is not limited to liquids but may be in the form of a gel (jelly or semisolid). Here, the etchant is used at a temperature ranging from ambient temperature to about 100° C., which is set appropriately according to a required etching rate or the like. When etching the object 1 made of silicon with KOH, for example, the temperature is preferably about 60° C.

As the etching, this embodiment performs anisotropic etching which is etching having a higher (or lower) etching rate in a specific direction according to a crystal orientation. The anisotropic etching is applicable not only to relatively thin objects but also to thick ones (having a thickness of 800 µm to 100 µm, for example). In this case, even when the surface to be formed with the modified region 7 differs from its plane direction, the etching can be advanced along the modified region 7. That is, the anisotropic etching here enables not only the etching of the plane direction in conformity to the crystal orientation, but also the etching independent of the crystal orientation.

Figure 7:
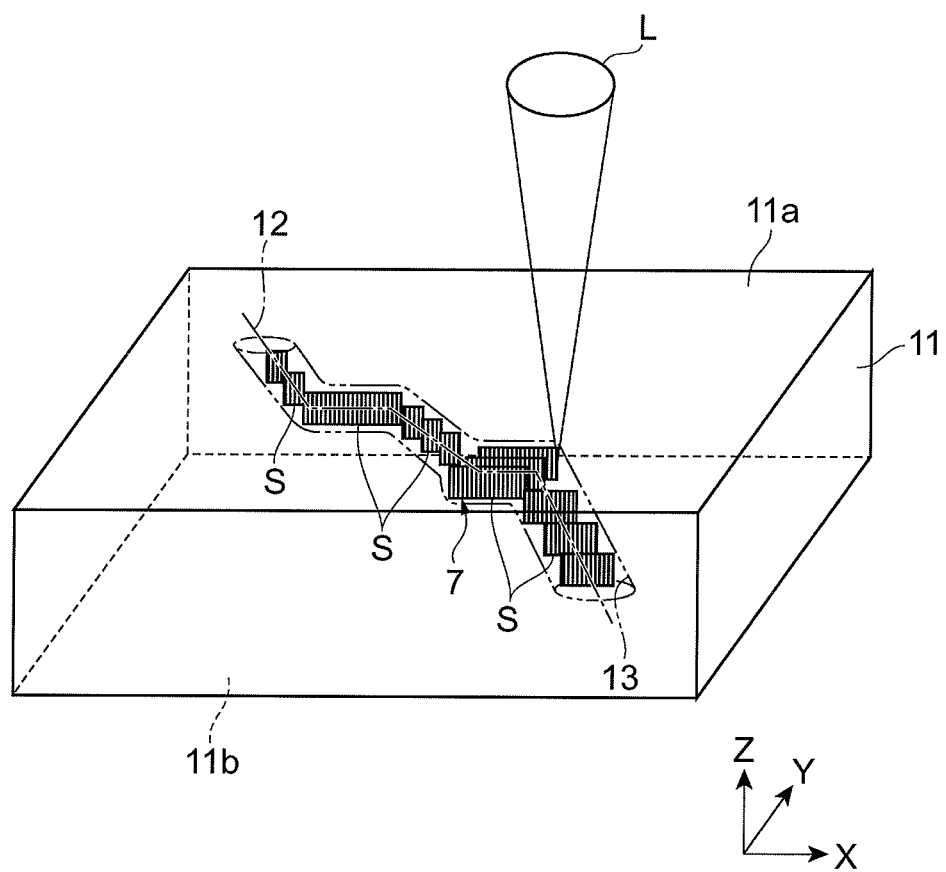
FIG. 7 is a perspective view of a silicon substrate for explaining the substrate processing method in accordance with an embodiment of the present invention.

The substrate processing method in accordance with an embodiment of the present invention will now be explained in detail. Here, as illustrated in FIG. 7, a laser light L is converged at a silicon substrate 11 (corresponding to the above-mentioned object 1), so as to form a plurality of modifies spots S within the silicon substrate 11 along a predetermined line 12 (corresponding to the above-mentioned line 5), thereby producing a modified region 7 including the plurality of modified spots S. Thereafter, the silicon substrate 11 is anisotropically etched, so as to advance an etching selectively along the modified region 7, thereby forming a through hole 13 in the silicon substrate 11. Thus constructed silicon substrate 11 is employed for a photomultiplier or interposer, for example. Let the thickness direction of the silicon substrate 11 be the Z direction, a predetermined direction perpendicular to the Z direction be the X direction, and a direction perpendicular to the Z and X directions be the Y direction.

The laser light L is a pulse-oscillated linearly-polarized light (i.e., elliptically-polarized light with an ellipticity of 0) and has such a wavelength as to be transmitted through the silicon substrate 11 by a predetermined transmittance. When forming the modified spot S, the laser light L is made incident on the silicon substrate 11 from its front face 11a along the Z direction while being relatively moved along the X direction. Each modified spot S is formed by a shot (irradiation) of one pulse of the laser light L, which is a pulsed laser light, while a plurality of modified spots S gather to form the modified region 7. Examples of the modified spots S include crack spots, molten processed spots, refractive index changed spots, and those having at least one of them mixed therein.

The silicon substrate 11 is made of a single crystal of silicon and has its front face 11a and rear face 11b in (100) planes. The predetermined line 12 is a reference line for forming the through hole 13 opening to the front face 11a and rear face 11b of the silicon substrate 11. For example, the line 12 is a center line of the through hole 13 (line passing the center of gravity of a cross-sectional form of the through hole 13 perpendicular to the line 12) and extends in the penetrating direction (extending direction) of the through hole 13.

Figure 8:
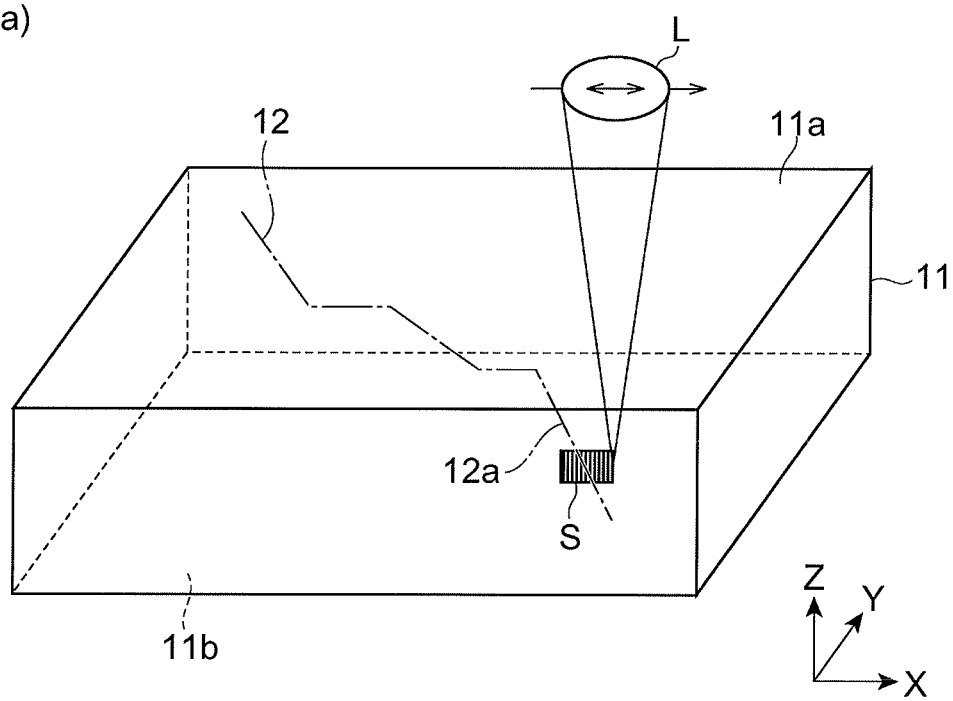
FIG. 8 is a perspective view of the silicon substrate for explaining the substrate processing method in accordance with the embodiment of the present invention.
Figure 8:
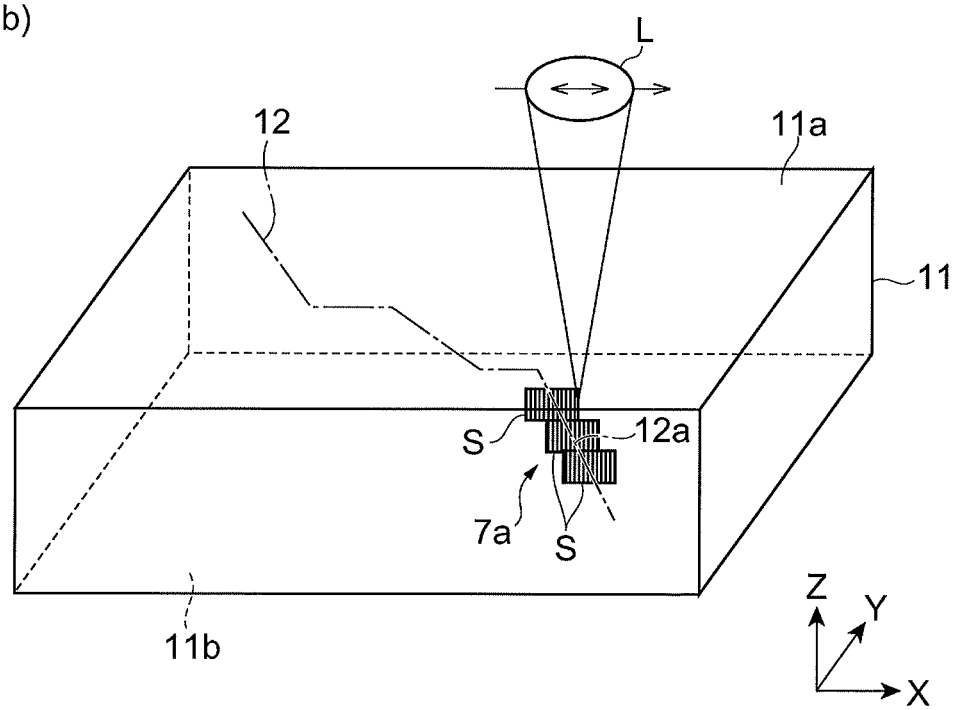

Individual steps of the substrate processing method in accordance with an embodiment of the present invention will now be explained more specifically. First, as illustrated in FIG. 8, the laser light L is converged at the silicon substrate 11, so as to form a plurality of modified spots S within the silicon substrate 11 along a line 12a and produce a modified region 7a including these modified spots S. The line 12a is a part of the line 12 located on the rear face 11b side of the silicon substrate 11 and extends in a tilted direction within a ZX plane. For the line 12a, the laser light L is converged at the silicon substrate 11 such that the moving direction of the laser light L with respect to the silicon substrate (hereinafter simply referred to as "moving direction of the laser light L") and the direction of polarization of the laser light L lie in the X direction and thus form an angle (hereinafter referred to as "polarization angle") of 0° therebetween.

Figure 9:
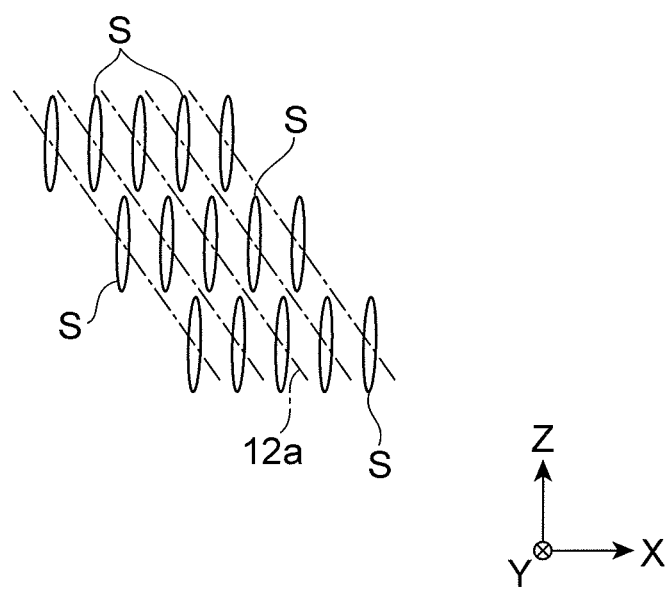
FIG. 9 is a view illustrating a plurality of modified spots formed such as to align in a plurality of rows along a predetermined line.

Here, as illustrated in FIG. 8(a), the silicon substrate 11 is irradiated with the laser light L in an on/off manner while locating a converging point of the laser light L (hereinafter simply referred to as "converging point") on the rear face 11b side on the line 12a within the silicon substrate 11 and moving the converging point along the X direction so as to form a plurality of modified spots S on the line 12a (X-direction scan along the line 12a). Subsequently, as illustrated in FIG. 8(b), the X-direction scan is performed a plurality of times along the line 12a while moving the converging point by predetermined distances toward the front face 11a in the Z direction. Thus, as illustrated in FIG. 9, a plurality of modified spots S are formed such as to align in a plurality of rows along the line 12a when seen in the Y direction (a predetermined direction perpendicular to the incident direction of the laser light L).

When forming the modified spots S on the rear face 11b side on the line 12a, end parts of the modified spots S are exposed to the rear face 11b. When forming the modified spots S along the line 12a, irradiation conditions of the laser light L (such as the moving speed of the laser light L with respect to the silicon substrate 11, the repetition frequency of the laser light L, and the predetermined distance by which the converging point is moved) are adjusted such that the modified spots S, S adjacent to each other are joined to each other directly or through fractures extending from the modified spots S.

Figure 10:
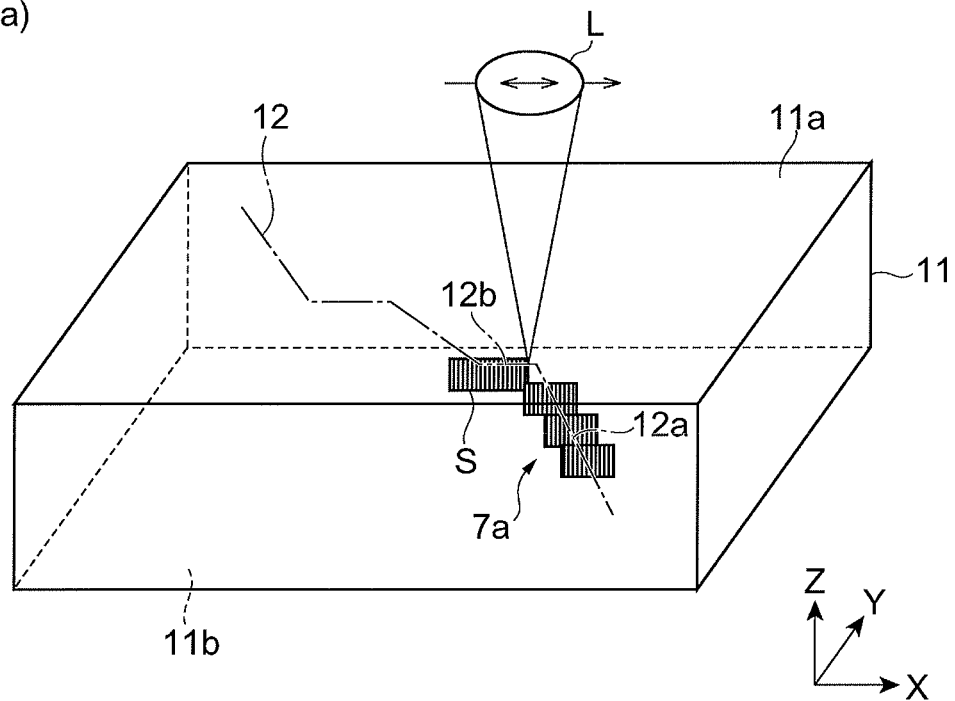
FIG. 10 is a perspective view of the silicon substrate for explaining the substrate processing method in accordance with the embodiment of the present invention.
Figure 10:
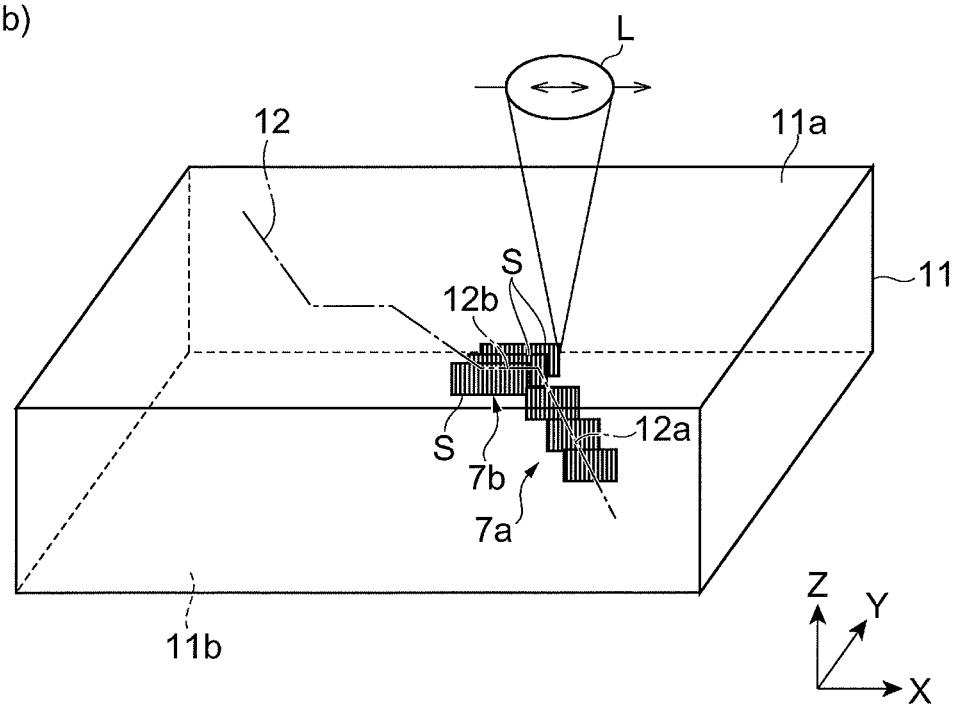

Subsequently, as illustrated in FIG. 10, the laser light L is converged at the silicon substrate 11, so as to form a plurality of modified spots S within the silicon substrate 11 along a line 12b and produce a modified region 7b including these modified spots S. The line 12b is a part of the line 12 extending from an end part of the line 12a and lies in the X direction. For the line 12b, the laser light L is converged at the silicon substrate 11 such that the moving direction of the laser light L and the direction of polarization of the laser light L lie in the X direction and thus form a polarization angle of 0° therebetween.

Figure 11:
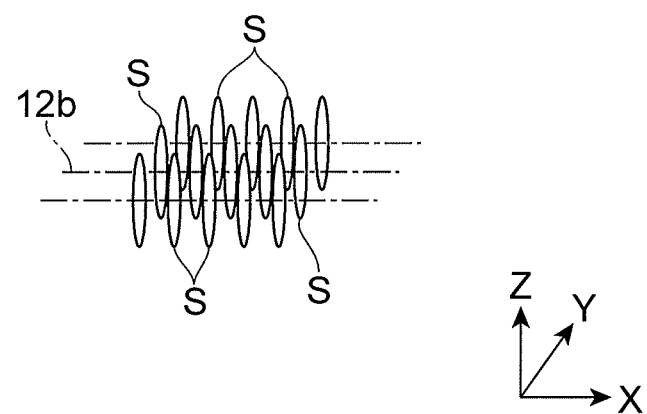
FIG. 11 is a view illustrating a plurality of modified spots formed such as to align in a plurality of rows along a predetermined line.

Here, as illustrated in FIG. 10(a), the silicon substrate 11 is irradiated with the laser light L in an on/off manner while locating the converging point on one side of the line 12b within the silicon substrate 11 and moving the converging point along the X direction so as to form a plurality of modified spots S along the line 12b (X-direction scan along the line 12b). Subsequently, as illustrated in FIG. 10(b), the X-direction scan is performed a plurality of times along the line 12b while moving the converging point by predetermined distances to the other side in the Y direction. Thus, as illustrated in FIG. 11, a plurality of modified spots S are formed such as to align in a plurality of rows along the line 12b when seen in the Z direction (the incident direction of the laser light L). When forming the modified spots S along the line 12b, irradiation conditions of the laser light L are adjusted such that the modified spots S, S adjacent to each other are joined to each other directly or through fractures extending from the modified spots S.

Figure 12:
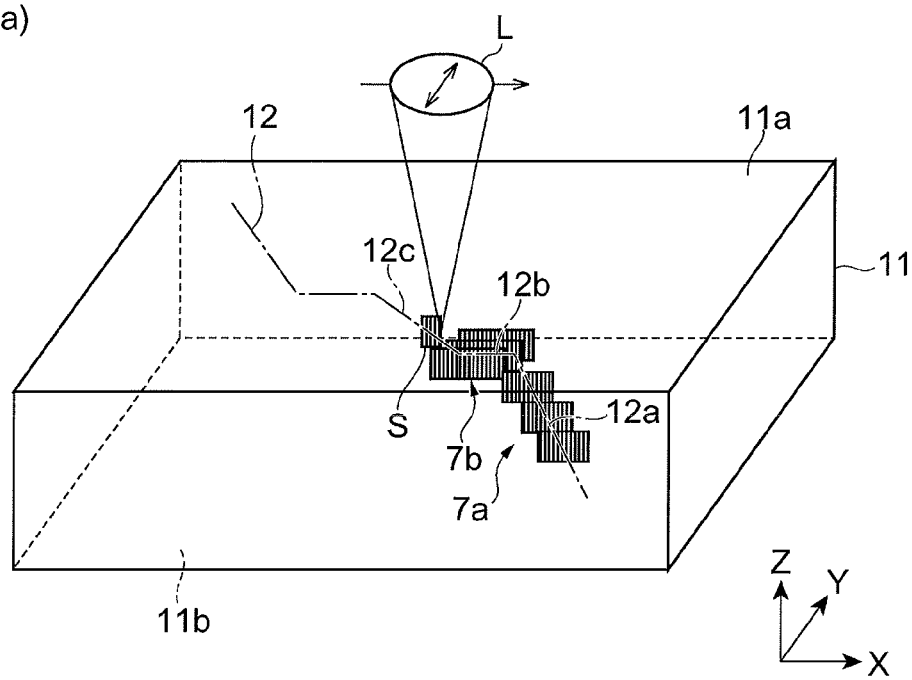
FIG. 12 is a perspective view of the silicon substrate for explaining the substrate processing method in accordance with the embodiment of the present invention.
Figure 12:
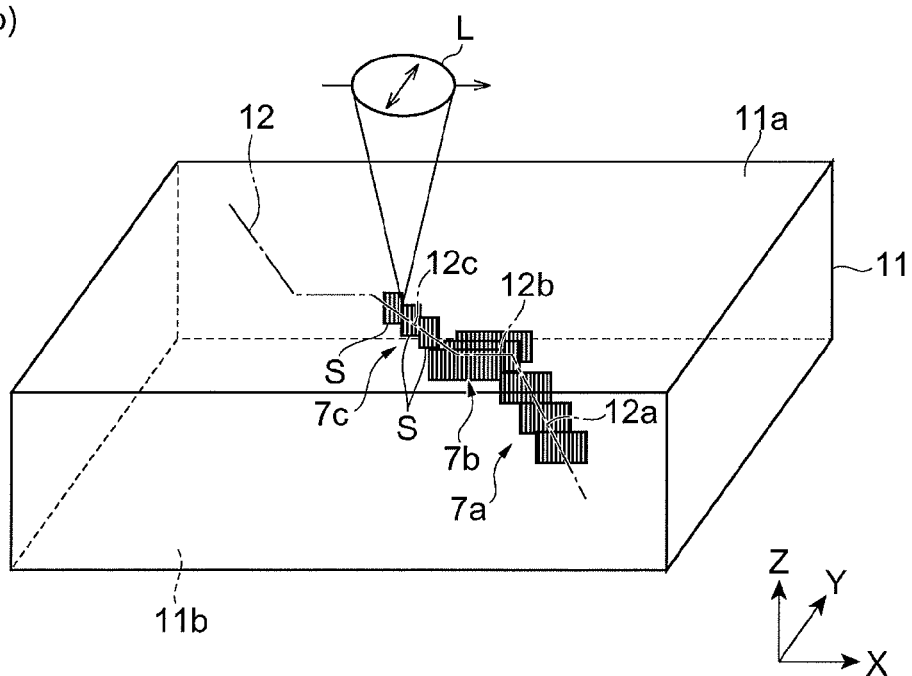

Next, as illustrated in FIG. 12, the laser light L is converged at the silicon substrate 11, so as to form a plurality of modified spots S within the silicon substrate 11 along a line 12c and produce a modified region 7c including these modified spots S. The line 12c is a part of the line 12 extending from an end part of the line 12b and lies in a tilted direction within a ZX plane. For the line 12c, the laser light L is converged at the silicon substrate 11 such that the moving direction of the laser light L and the direction of polarization of the laser light L lie in the X and Y directions, respectively, and thus form a polarization angle of 90° therebetween.

Here, as illustrated in FIG. 12(a), the silicon substrate 11 is irradiated with the laser light L in an on/off manner while locating the converging point on the rear face 11b side on the line 12c within the silicon substrate 11 and moving the converging point along the X direction so as to form a plurality of modified spots S on the line 12c (X-direction scan along the line 12c). Subsequently, as illustrated in FIG. 12(b), the X-direction scan is performed a plurality of times along the line 12c while moving the converging point by predetermined distances toward the front face 11a in the Z direction. Thus, a plurality of modified spots S are formed such as to align in one row along the line 12c (so that all the modified spots S included in the modified region 7c are positioned on the line 12c) while the modified spots S adjacent to each other partly overlap each other when seen in the X direction (a predetermined direction perpendicular to the incident direction of the laser light L). When forming the modified spots S along the line 12c, irradiation conditions of the laser light L are adjusted such that the modified spots S, S adjacent to each other are joined to each other directly or through fractures extending from the modified spots S.

Figure 13:
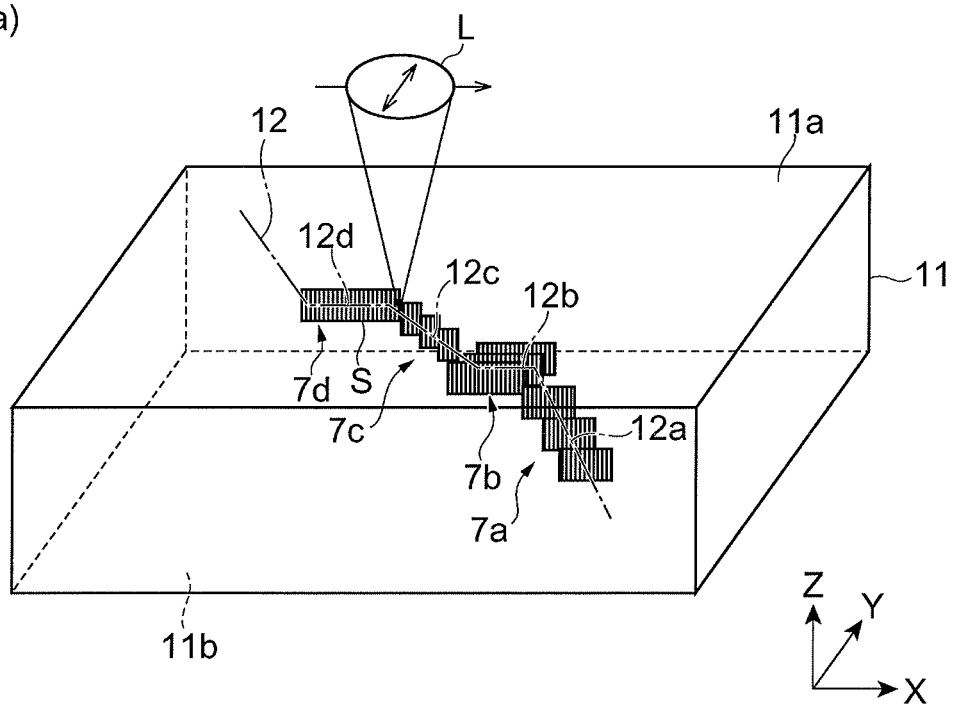
FIG. 13 is a perspective view of the silicon substrate for explaining the substrate processing method in accordance with the embodiment of the present invention.
Figure 13:
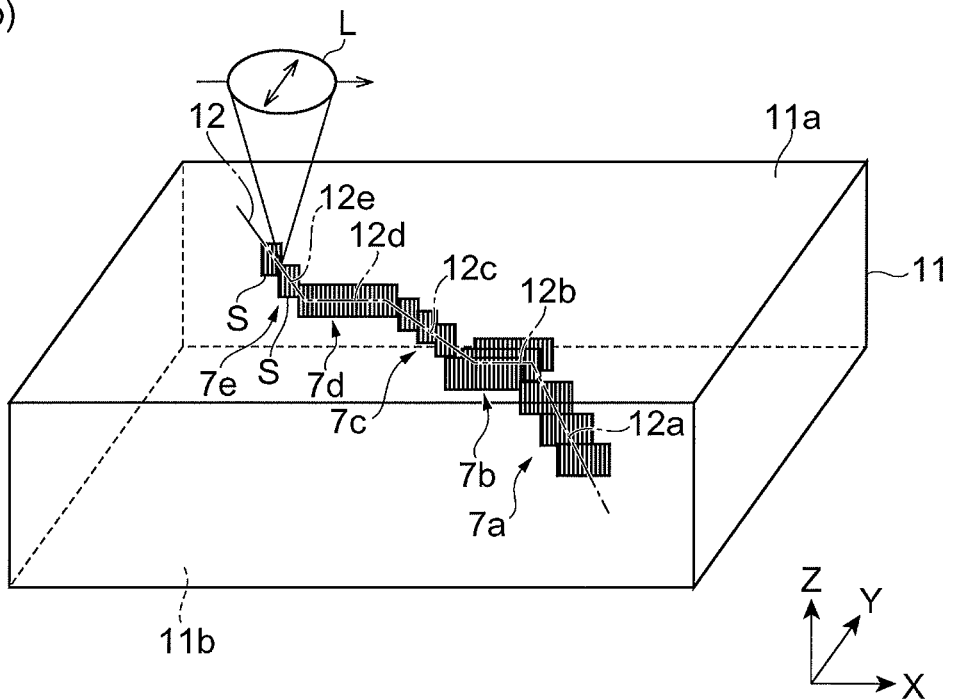

Next, as illustrated in FIG. 13(a), the laser light L is converged at the silicon substrate 11, so as to form a plurality of modified spots S within the silicon substrate 11 along a line 12d and produce a modified region 7d including these modified spots S. The line 12d is a part of the line 12 extending from an end part of the line 12c and lies in the X direction. For the line 12d, the laser light L is converged at the silicon substrate 11 such that the moving direction of the laser light L and the direction of polarization of the laser light L lie in the X and Y directions, respectively, and thus form a polarization angle of 90° therebetween.

Here, the silicon substrate 11 is irradiated with the laser light L in an on/off manner while locating the converging point at an end part on the line 12d within the silicon substrate 11 and moving the converging point along the X direction so as to form a plurality of modified spots S on the line 12d (X-direction scan along the line 12d). Thus, a plurality of modified spots S are formed such as to align in one row along the line 12d (so that all the modified spots S included in the modified region 7d are positioned on the line 12d). When forming the modified spots S along the line 12d, irradiation conditions of the laser light L are adjusted such that the modified spots S, S adjacent to each other are joined to each other directly or through fractures extending from the modified spots S.

Subsequently, as illustrated in FIG. 13(b), the laser light L is converged at the silicon substrate 11, so as to form a plurality of modified spots S within the silicon substrate 11 along a line 12e and produce a modified region 7e including these modified spots S. The line 12e is a part of the line 12 located on the front face 11a side of the silicon substrate 11 while extending from an end part of the line 12d and lies in a tilted direction within a ZX plane. For the line 12e, the laser light L is converged at the silicon substrate 11 such that the moving direction of the laser light L and the direction of polarization of the laser light L lie in the X and Y directions, respectively, and thus form a polarization angle of 90° therebetween.

Here, the silicon substrate 11 is irradiated with the laser light L in an on/off manner while locating the converging point on the rear face 11b side on the line 12e within the silicon substrate 11 and moving the converging point along the X direction so as to form a plurality of modified spots S on the line 12e (X-direction scan along the line 12e). Subsequently, the X-direction scan is performed a plurality of times along the line 12e while moving the converging point by predetermined distances toward the front face 11a in the Z direction. Thus, a plurality of modified spots S are formed such as to align in one row along the line 12e (so that all the modified spots S included in the modified region 7e are positioned on the line 12e) while the modified spots S adjacent to each other partly overlap each other when seen in the X direction (a predetermined direction perpendicular to the incident direction of the laser light L).

When forming the modified spots S on the front face 11a side on the line 12e, end parts of the modified spots S are exposed to the front face 11a. When forming the modified spots S along the line 12e, irradiation conditions of the laser light L are adjusted such that the modified spots S, S adjacent to each other are joined to each other directly or through fractures extending from the modified spots S.

Figure 14:
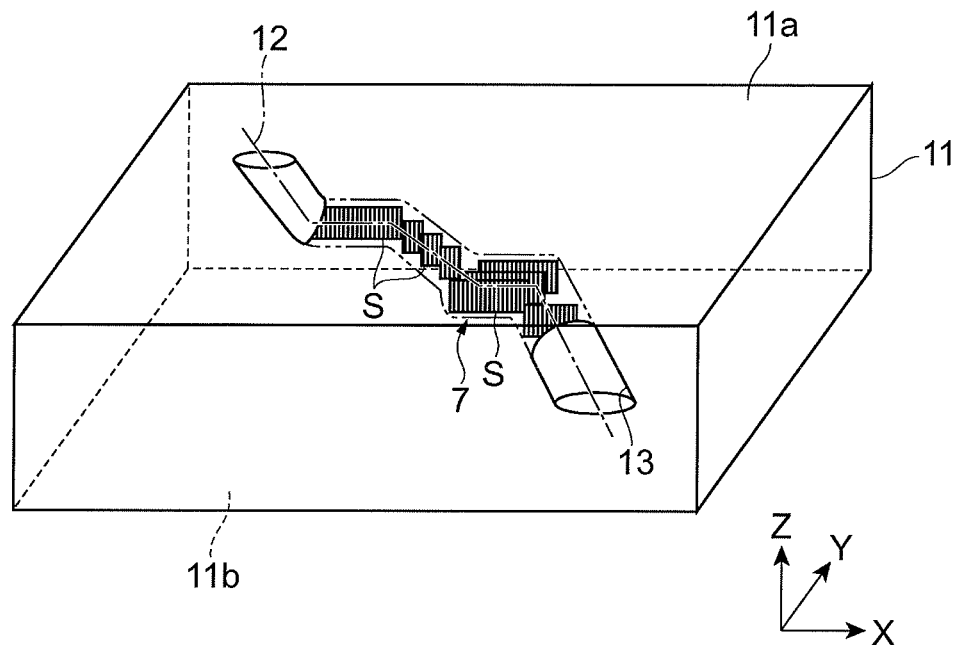
FIG. 14 is a perspective view of the silicon substrate for explaining the substrate processing method in accordance with the embodiment of the present invention.
Figure 14:
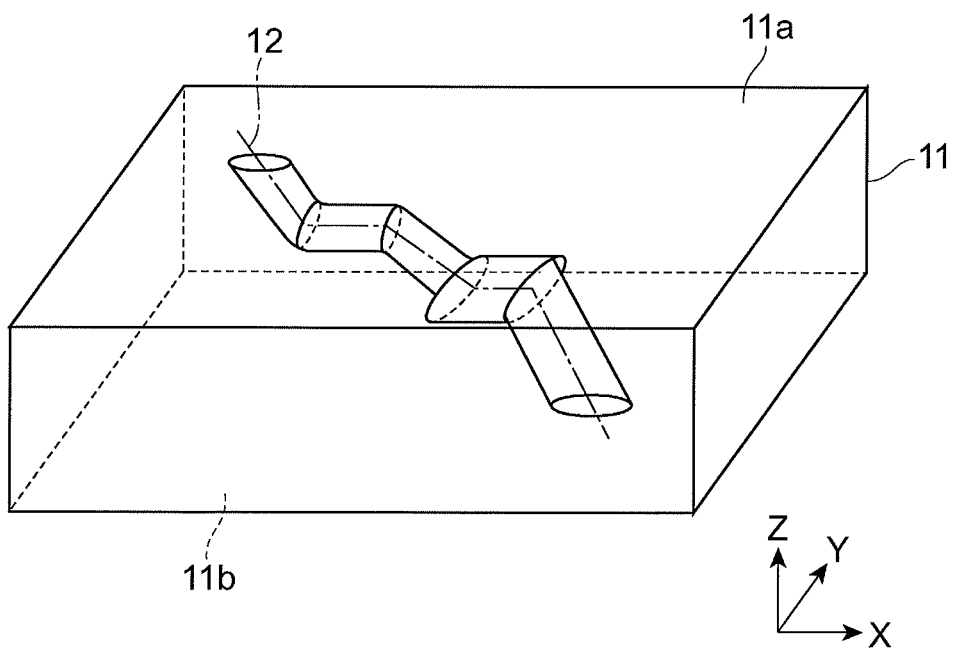

After forming the silicon substrate 11 with the modified region 7 as in the foregoing, the silicon substrate 11 is anisotropically etched with KOH at 85° C., for example, employed as an etchant. This lets the etchant progress and infiltrate from the front face 11a and rear face 11b into the modified region 7 in the silicon substrate 11, so as to advance (develop) the etching along the modified region 7 from the front face 11a and rear face 11b to the inside. As a result, as illustrated in FIG. 14(b), the part of the silicon substrate 11 extending along the modified region 7 is removed, whereby the forming of the through hole 13 is completed.

Figure 15:
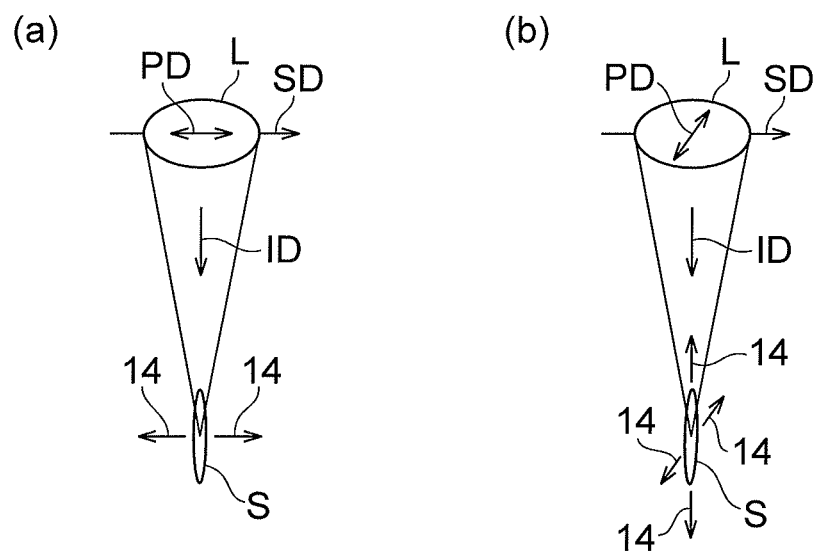
FIG. 15 is a view illustrating the relationship between the direction of polarization of a laser light and the extending direction of fractures.

As explained in the foregoing, when forming the modified spots S along the lines 12a, 12b, in the above-mentioned substrate processing method, the laser light L is converged at the silicon substrate 11 such that the polarization angle is 0°. As illustrated in FIG. 15(a), when the laser light L is converged such that the moving direction SD of the laser light L and the direction of polarization PD of the laser light L form a polarization angle of 0° therebetween, fractures 14 can be extended more from the modified spots S into the moving direction SD of the laser light L than when the laser light L is converged such that the polarization angle is 90° (see FIG. 15(b)). Therefore, in the case of forming a plurality of modified spots S aligning in a plurality of rows along the lines 12a, 12b as illustrated in FIGS. 9 and 11, when forming a plurality of modified spots S on one of the adjacent rows and then on the other, fractures extending from the existing modified spots S on the one row are less likely to inhibit the laser light L from converging even if the line 12 extends in a tilted direction as with the line 12a, for example, whereby a plurality of modified spots S are formed reliably. Therefore, when the silicon substrate 11 is anisotropically etched, the etching reliably advances along the modified regions 7. Hence, the above-mentioned substrate processing method can accurately form through holes 13 having various shapes in the silicon substrate 11.

For the line 12a, a plurality of modified spots S are formed such as to align in a plurality of rows along the line 12a when seen in a predetermined direction (the Y direction in the above-mentioned substrate processing method) perpendicular to the incident direction of the laser light L as illustrated in FIG. 8(b). This can form the through hole 13 having a desirable cross-sectional shape (a wide shape, a complicated shape, etc.) when seen in the predetermined direction as illustrated in FIG. 14(b).

For the line 12b, a plurality of modified spots S are formed such as to align in a plurality of rows along the line 12b when seen in the incident direction of the laser light L (the Z direction in the above-mentioned substrate processing method) as illustrated in FIG. 10(b). This can form the through hole 13 having a desirable cross-sectional shape (a wide shape, a complicated shape, etc.) when seen in the incident direction as illustrated in FIG. 14(b).

When forming the modified spots S along the lines 12c, 12d, 12e, the above-mentioned substrate processing method converges the laser light at the silicon substrate 11 such that the polarization angle is 90°. As illustrated in FIG. 15(b), when the laser light L is converged such that the moving direction SD of the laser light L and the direction of polarization PD of the laser light L form a polarization angle of 90° therebetween, fractures 14 can be extended more from the modified spots S into the incident direction ID of the laser light L and a lateral direction (a direction perpendicular to the incident direction ID of the laser light L and the moving direction SD of the laser light) than when the laser light L is converged such that the polarization angle is 0° (see FIG. 15(a)). Therefore, when forming a plurality of modified spots S aligning in one row along the lines 12c, 12d, 12e as illustrated in FIG. 13(b), even if the line 12 extends in a tilted direction as with the lines 12c, 12e, for example, fractures extending from the adjacent existing modified spots S are harder to inhibit the laser light L from converging, whereby a plurality of modified spots S are formed reliably. Further, fractures are easier to join with each other between the modified spots S, S adjacent to each other in the tilted direction. As a consequence, when the silicon substrate 11 is anisotropically etched, the etching reliably advances along the modified regions 7. Hence, the above-mentioned substrate processing method can accurately form through holes 13 having various shapes in the silicon substrate 11.

For the lines 12c, 12e, a plurality of modified spots S are formed such that the modified spots S, S adjacent to each other partly overlap each other therebetween when seen in a predetermined direction (the X direction in the above-mentioned substrate processing method) perpendicular to the incident direction of the laser light L. This can more reliably join the adjacent modified spots S, S to each other directly or through fractures extending from the modified spots S. Therefore, even when advancing the selective etching of the modified regions 7 in a tilted direction, the etching can progress favorably without interruption.

Figure 16:
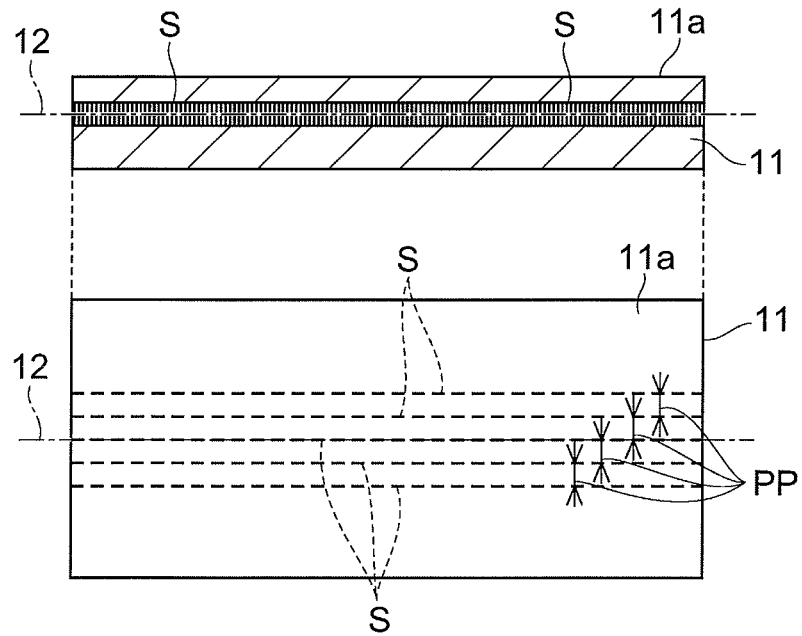
FIG. 16 is a sectional and plan view of the silicon substrate formed with a plurality of modified spots aligning in one or a plurality of rows along a predetermined line.
Figure 16:
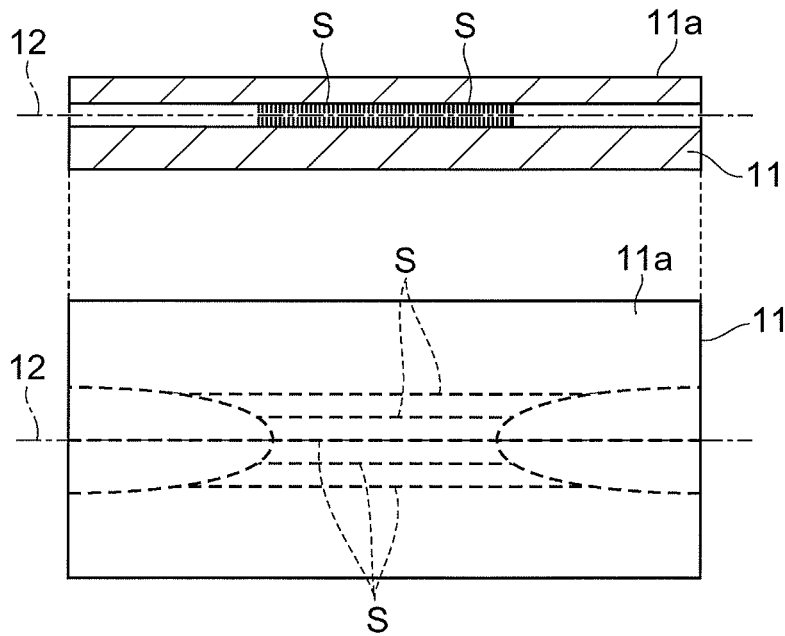

Results of experiments will now be explained. FIG. 16 is a sectional and plan view of the silicon substrate formed with a plurality of modified spots aligning in one or a plurality of rows along a predetermined line. As illustrated in FIG. 16(a), the laser light L was converged at the silicon substrate 11, so as to form a plurality of modifies spots S aligning in one or a plurality of rows along the line 12. The thickness of the silicon substrate 11 was 300 μm (ditto for the following experiments unless otherwise specified). Irradiation with the laser light L was performed under conditions with a wavelength of 1064 nm, a repetition frequency of 400 kHz, a pulse width of 106 ns, an output of 0.6 W, a moving speed of 100 mm/s with respect to the silicon substrate 11, and a pulse pitch of 0.25 μm (100 mm/s/400 kHz) (ditto for the following experiments unless otherwise specified). When forming a plurality of rows of modified spots S along the line 12, each row was positioned on a plane parallel to the front face 11a of the silicon substrate 11.

Figure 17:
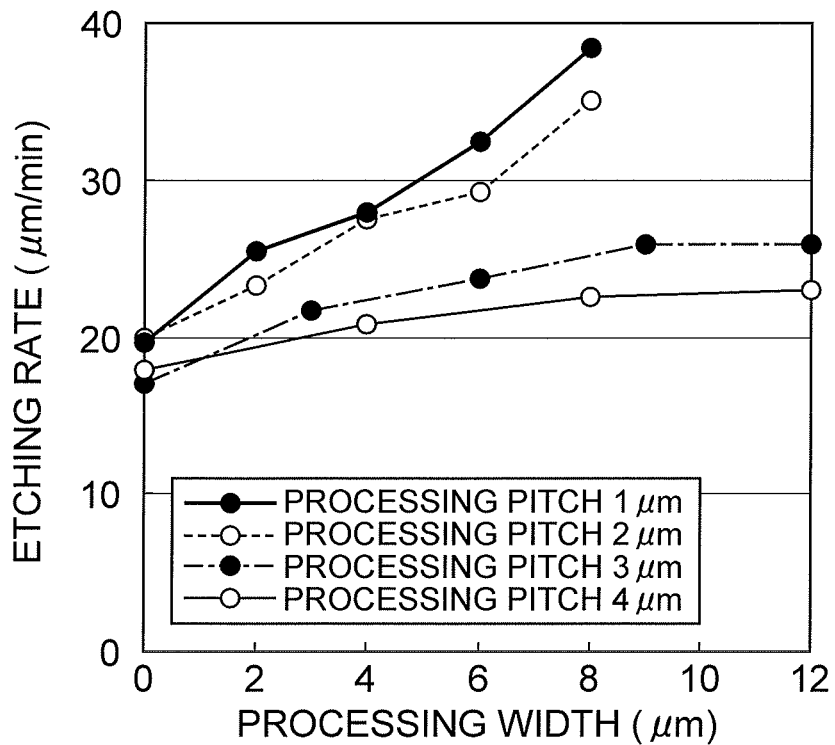
FIG. 17 is a graph illustrating relationships between the processing width and the etching rate.
Figure 17:
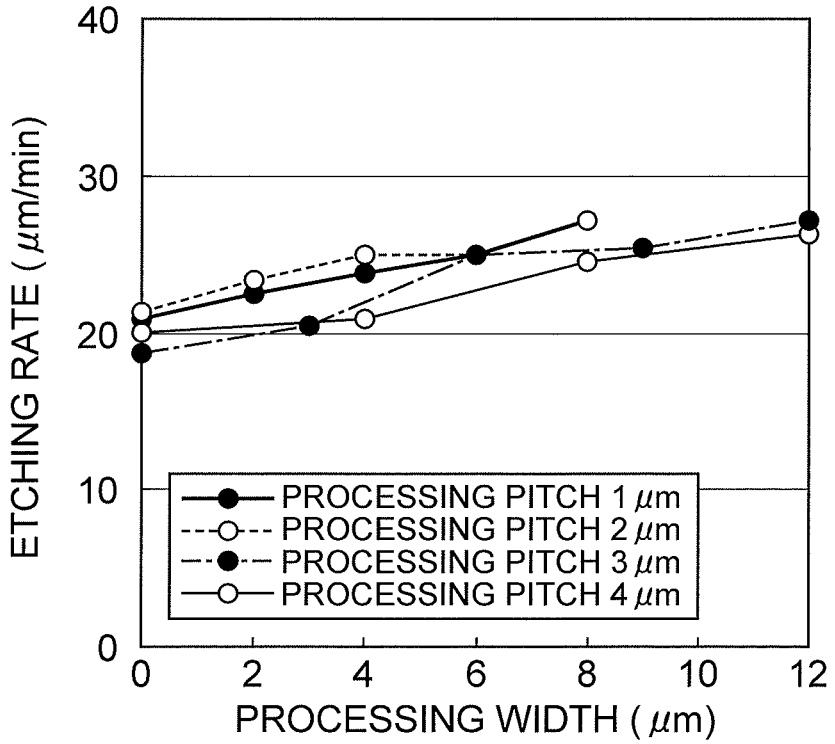
Figure 18:
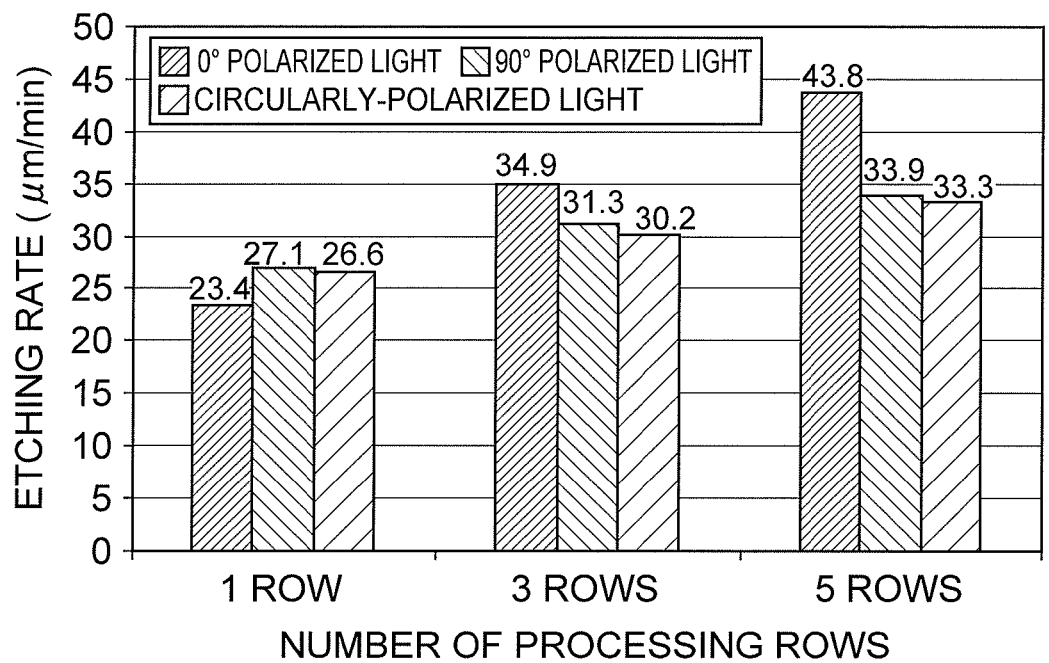
FIG. 18 is a graph illustrating relationships between the number of processing rows and the etching rate.
Figure 19:
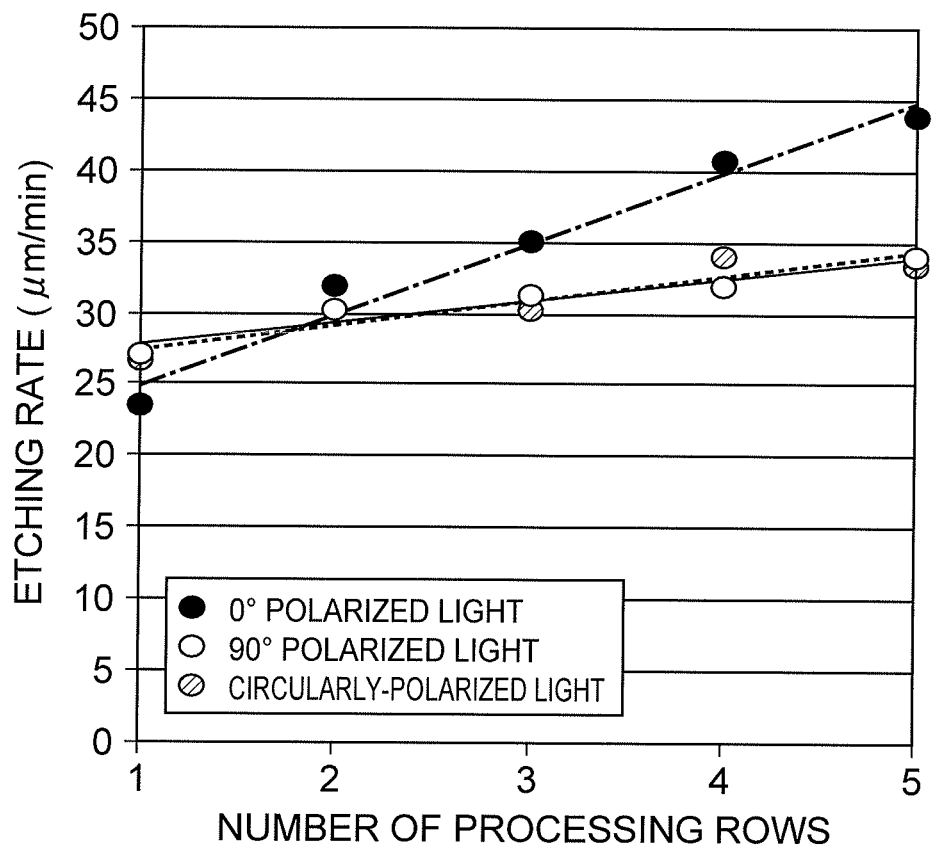
FIG. 19 is a graph illustrating relationships between the number of processing rows and the etching rate.

Then, as illustrated in FIG. 16(b), the silicon substrate 11 was anisotropically etched with 48% KOH at 85° C. employed as an etchant (ditto for the following experiments unless otherwise specified), so as to advance the etching from both end faces on the line 12. FIGS. 17 to 19 represent the results of experiments. In the following experiments, when a plurality of rows of modified spots S are formed along the line 12, the gap PP between the rows adjacent to each other will be referred to as processing pitch (see FIG. 16(a)), while the number of rows will be referred to as number of processing rows.

FIG. 17 is a graph illustrating the relationships between the processing width (processing pitch×number of processing rows) and the etching rate (the processing width of 0 in the abscissa in the graphs of FIGS. 17(a) and (b) indicating the case with one processing row). In FIG. 17, (a) represents a case where the laser light L was converged such that the polarization angle became 0° (hereinafter referred to as "case of 0° polarized light"), while (b) represents a case where the laser light L was converged such that the polarization angle became 90° (hereinafter referred to as "case of 90° polarized light"). In the case of 0° polarized light, as illustrated in FIG. 17(a), the etching rate became higher as the processing pitch was narrower and as the number of processing rows was greater. In the case of 90° polarized light, by contrast, as illustrated in FIG. 17(b), the etching rate did not increase so much when the processing pitch was narrowed. This makes the 0° polarized light have an advantage over the 90° polarized light when forming a plurality of modified spots S aligning in a plurality of rows along the predetermined line 12.

FIGS. 18 and 19 are graphs illustrating relationships between the number of processing rows and the etching rate. Here, while the processing pitch was held constant at 2 μm, the number of processing rows was changed. As a result, as illustrated in FIGS. 18 and 19, the etching rate rose greatly as the number of processing rows increased in the case of 0° polarized light. In the case of 90° polarized light, by contrast, the etching rate did not rise so much when the number of processing rows increased as in the case of circularly-polarized light. This also makes the 0° polarized light have an advantage over the 90° polarized light when forming a plurality of modified spots S aligning in a plurality of rows along the predetermined line 12.

Figure 20:
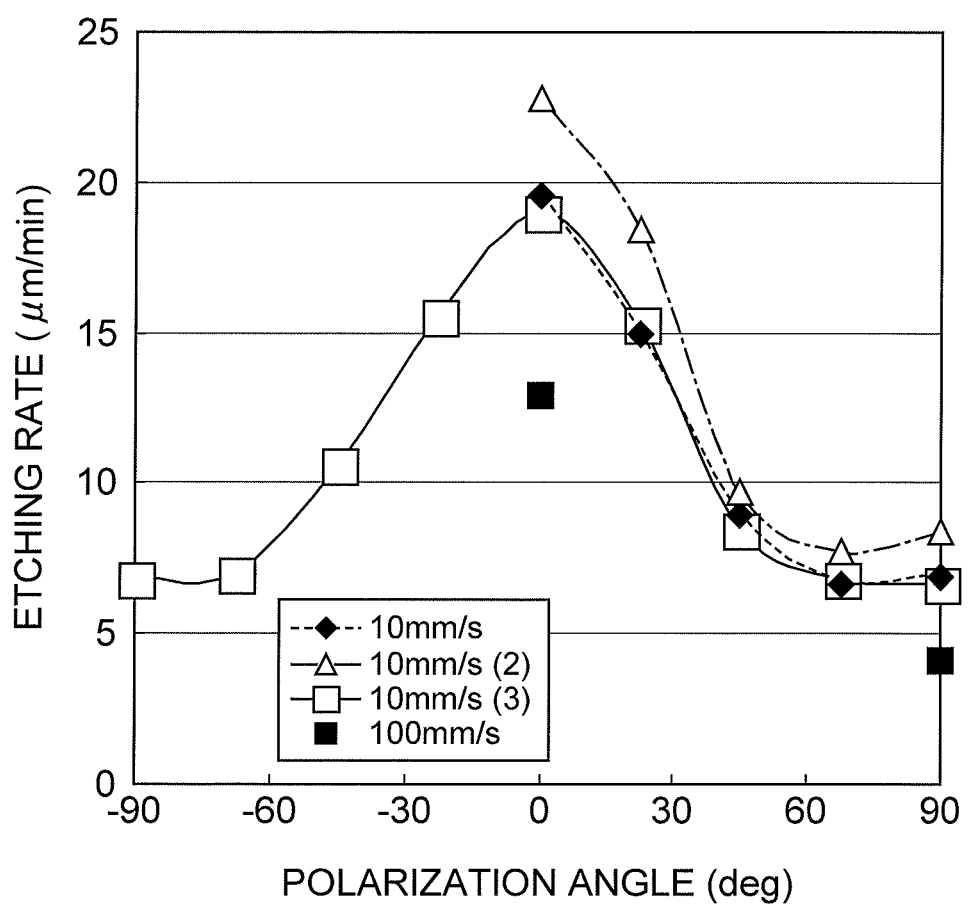
FIG. 20 is a graph illustrating relationships between the polarization angle and the etching rate.

FIG. 20 is a graph illustrating relationships between the polarization angle and the etching rate. Here, while the processing pitch and the number of processing rows were held constant at 1 μm and 9, respectively, the polarization angle was changed. In the above-mentioned irradiation conditions of the laser light L, the moving speed of the laser light L with respect to the silicon substrate 11 was changed. Also, the silicon substrate 11 was anisotropically etched with 22% TMAH at 85° C. employed as an etchant. As a result, as illustrated in FIG. 20, the etching rate was higher when the polarization angle was less than 45° (−45 deg<polarization angle<45 deg) than when the polarization angle was 45° or greater (−90 deg≤polarization angle≤−45 deg, 45 deg≤polarization angle≤90 deg) and the highest in the case of 0° polarized light. This makes the case with the polarization angle of less than 45° have an advantage over the case with the polarization angle of 45° or greater when forming a plurality of modified spots S aligning in a plurality of rows along the predetermined line 12.

Figure 21:
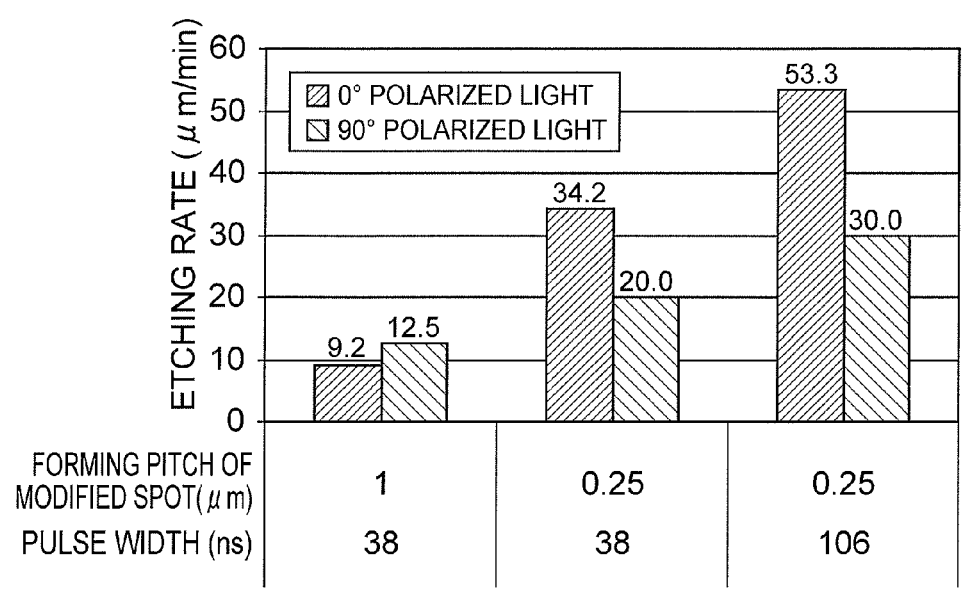
FIG. 21 is a graph illustrating relationships between the forming pitch and pulse width of modified spots and the etching rate.

FIG. 21 is a graph illustrating relationships between the forming pitch (pulse pitch) and pulse width of modified spots and the etching rate. Here, while the number of processing rows was held constant at 9, the forming pitch and pulse width of the modified spots S were changed. The silicon substrate 11 was anisotropically etched with 22% TMAH at 85° C. employed as an etchant. As a result, as illustrated in FIG. 21, the etching rate was higher when the forming pitch of modified spots S was narrower either in the case of 0° polarized light or in the case of 90° polarized light. Further, the etching rate was higher when the pulse width was longer either in the case of 0° polarized light or in the case of 90° polarized light. These were more remarkable in the case of 0° polarized light than in the case of 90° polarized light.

The forming pitch of the modified spots S is equivalent to the forming pitch of the converging point of the pulsed laser light L, i.e., the irradiation pitch of the laser light L per pulse. When the forming pitch is 1 μm, the modified spot S is separated from the modified spot S formed by the preceding laser irradiation to such an extent as to be distinguishable therefrom (i.e., such an extent that the modified spots adjacent to each other are distinguishable). When the forming pitch is 0.25 μm, by contrast, the modified region is formed such that the modified spot S overlaps the modified spot S formed by the preceding laser irradiation. When the forming pitch of the modified spots S is 1 μm in the case with a plurality of processing rows, the etching rate is higher in the 90° polarized light than in the 0° polarized light as can be seen from FIG. 21. When the forming pitch of the modified spots S is 0.25 μm in the case with a plurality of processing rows, on the other hand, the etching rate is higher in the 0° polarized light than in the 90° polarized light. Thus, the forming pitch of the modified spots S reduces (or actually reverses) the difference in relationship between the etching rate and polarization angle. As a consequence, the etching rate becomes higher in the 0° polarized light (i.e., at the polarization angle of less than 45°) at such a pitch (about 0.8 μm or less) as to form the modified region in which each modified spot S overlaps the one formed by the preceding laser irradiation.

Figure 22:
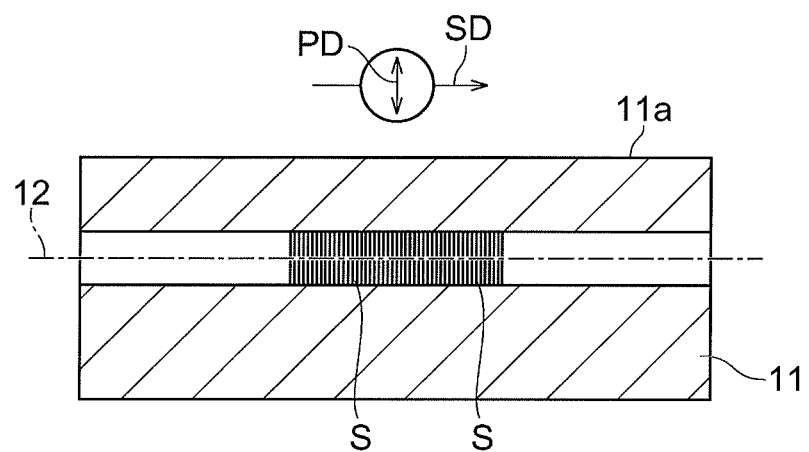
FIG. 22 is a sectional view of a silicon substrate when a plurality of modified spots are formed in a row along a predetermined direction perpendicular to an incident angle of a laser light.
Figure 22:
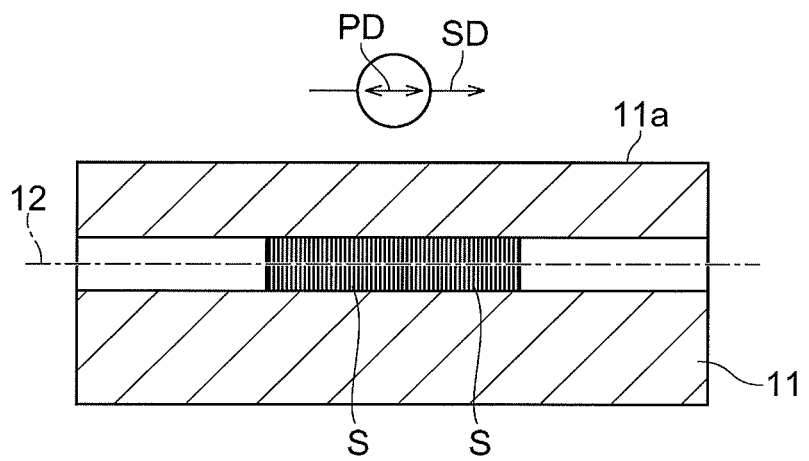
Figure 23:
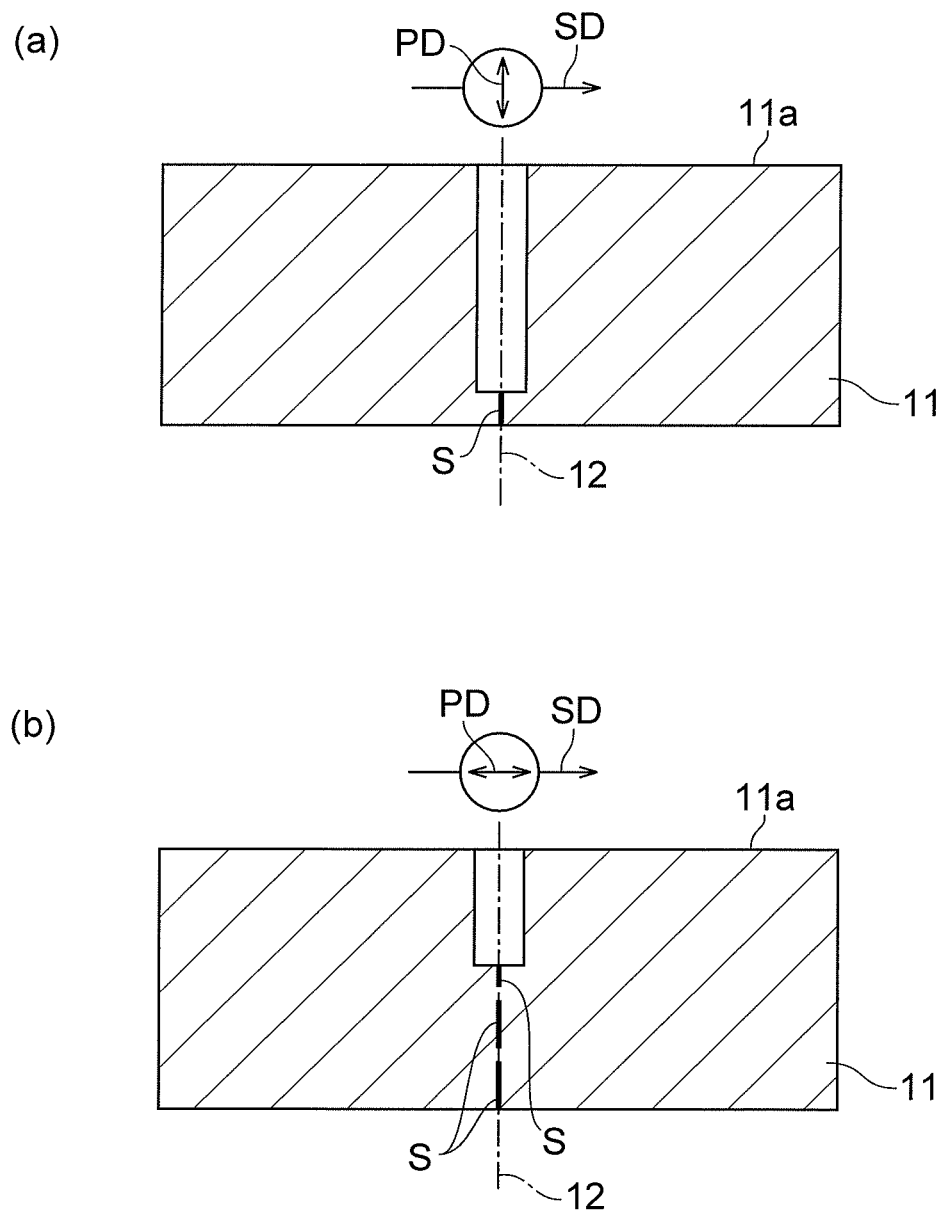
FIG. 23 is a sectional view of a silicon substrate when a plurality of modified spots are formed in a row along the incident angle of the laser light.

FIG. 22 is a sectional view of a silicon substrate when a plurality of modified spots are formed in a row along a predetermined direction perpendicular to an incident angle of a laser light, while FIG. 23 is a sectional view of a silicon substrate when a plurality of modified spots are formed in a row along the incident angle of the laser light. When a plurality of modified spots S were formed in a row along a predetermined direction perpendicular to the incident angle of the laser light L as illustrated in FIG. 22, the etching rate was slightly higher in the case of 90° polarized light (the case of (a)) than in the case of 0° polarized light (the case of (b)). When a plurality of modified spots S were formed in a row along the incident angle of the laser light L as illustrated in FIG. 23, the etching rate was much higher in the case of 90° polarized light (the case of (a)) than in the case of 0° polarized light (the case of (b)). This makes the 90° polarized light have an advantage over the 0° polarized light when forming a plurality of modified spots S aligning in a row along a predetermined line 12.

Figure 24:
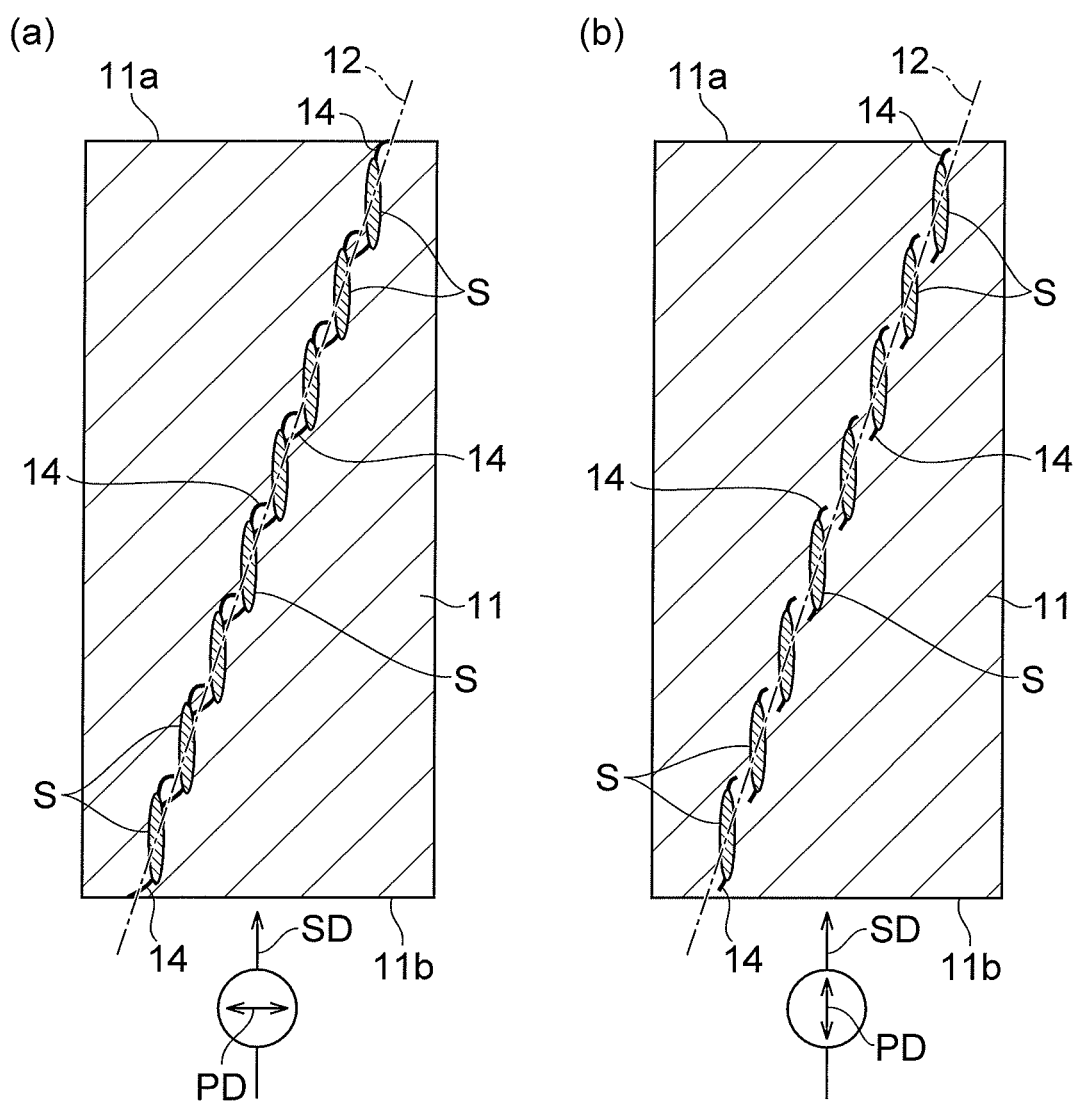
FIG. 24 is a sectional view of a silicon substrate when a plurality of modified spots are formed in a row along a tilted direction.

FIG. 24 is a sectional view of a silicon substrate when a plurality of modified spots are formed in a row along a tilted direction. Here, the laser light L was moved in a direction perpendicular to the drawing. As a result, the fractures 14 were easier to extend in the incident direction of the laser light L in the case of 90° polarized light, whereby the fractures 14 extending from the modified spots S on the front face 11a side and rear face 11b side reached the front face 11a and rear face 11b, respectively, as illustrated in FIG. 24(a). The fractures 14 joined with each other between the modified spots S, S adjacent to each other. By contrast, the fractures 14 were harder to extend in the incident direction of the laser light L in the case of 0° polarized light, whereby the fractures 14 extending from the modified spots S on the front face 11a side and rear face 11b side failed to reach the front face 11a and rear face 11b, respectively, as illustrated in FIG. 24(b). The fractures 14 failed to join with each other between the modified spots S, S adjacent to each other. This makes the 90° polarized light have an advantage over the 0° polarized light when forming a plurality of modified spots S aligning in a row along a predetermined line 12 even if the predetermined line 12 lies in the tilted direction.

Though an embodiment of the present invention has been explained in the foregoing, the present invention is not limited thereto. For example, when forming the modified region 7, the entrance surface for the laser light L is not limited to the front face 11a of the silicon substrate 11 but may be the rear face 11b of the silicon substrate 11. While the above-mentioned embodiment forms the silicon substrate 11 with the through hole 13, the silicon substrate 11 may be formed with spaces having various shapes (e.g., depressions (blind holes) opening to the front face 11a or rear face 11b alone, grooves, channels, and slits) in place of the through hole 13. The silicon substrate 11 can accurately be formed with spaces extending along the predetermined line 12 in this case as well.

Though the modified spots S are exposed to the front face 11a and rear face 11b of the silicon substrate 11 in the above-mentioned embodiment, fractures extending from the modified spots S may be exposed to the front face 11a and rear face 11b of the silicon substrate 11 instead of the modified spots S. That is, it will be sufficient if the modified spots S or fractures extending from the modified spots S are exposed to the front face 11a and rear face 11b of the silicon substrate 11. Exposing the modified spots S to the front face 11a and rear face 11b can increase the aperture ratio of the resulting through hole 13, so as to enhance the efficiency in collecting electrons when employing this embodiment in a photomultiplier, for example. On the other hand, exposing fractures instead of the modified spots S can restrain the through hole 13 from increasing its size on the opening side, whereby the pore size of the through hole 13 on the opening side can be the same as that on the inside thereof.

Since doping the etchant with additives can change the etching rate in a specific crystal orientation, the etchant may be doped with an additive corresponding to the crystal orientation of the silicon substrate 11 in order to perform anisotropic etching at a desirable etching rate.

Figure 25:
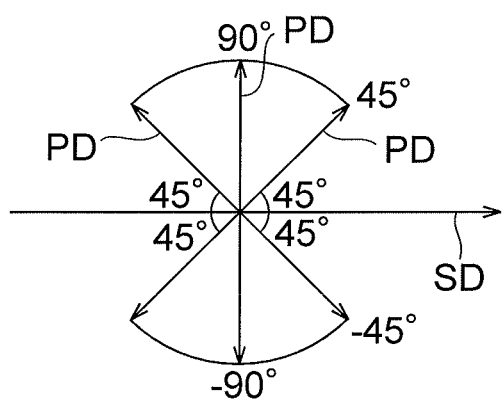
FIG. 25 is a view illustrating relationships between the moving direction of a laser light and the direction of polarization of the laser light.
Figure 25:
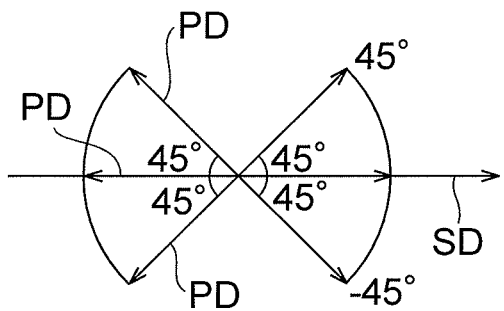

When forming a plurality of modified spots S aligning in a plurality of rows along a predetermined line 12, the laser light L is not limited to linearly-polarized light having an ellipticity of 0, but may be elliptically-polarized light having an ellipticity other than 1. As illustrated in FIG. 25(b), when converging the laser light L at the silicon substrate 11, the polarization angle is not limited to 0°, but may be less than 45°. Irradiation with such laser light L can also extend the fractures 14 more from the modified spots S into the moving direction SD of the laser light L than when the laser light L is converged such that the polarization angle is 45° or greater. However, fractures are more restrained from extending from the modified spots S into directions other than the moving direction of the laser light L as the ellipticity of the elliptically-polarized light is smaller and as the polarization angle is closer to 0°.

When forming a plurality of modified spots S aligning in one row along the predetermined line 12, the laser light L is not limited to linearly-polarized light having an ellipticity of 0, but may be elliptically-polarized light having an ellipticity other than 1. As illustrated in FIG. 25(a), when converging the laser light L at the silicon substrate 11, the polarization angle is not limited to 90°, but may be 45° or greater. Irradiation with such laser light L can also extend the fractures 14 more from the modified spots S into the incident direction of the laser light L and a lateral direction (a direction perpendicular to the incident direction ID of the laser light L and the moving direction SD of the laser light) than when the laser light L is converged such that the polarization angle is less than 45°. However, fractures are more restrained from extending from the modified spots S into directions other than the incident direction of the laser light L and lateral direction as the ellipticity of the elliptically-polarized light is smaller and as the polarization angle is closer to 90°.

Here, as illustrated in FIG. 25(a), the polarization angle of 45° or greater means the ranges of −90°≤polarization angle≤−45° and 45°≤polarization angle≤90° in the range of −90°≤polarization angle≤90° defining the range of the angle formed between the moving direction SD of the laser light L and the direction of polarization PD of the laser light L. As illustrated in FIG. 25(b), the polarization angle of less than 45° means the ranges of −45°≤polarization angle≤45° in the range of −90°≤polarization angle≤90° defining the range of the angle formed between the moving direction SD of the laser light L and the direction of polarization PD of the laser light L.

Figure 26:
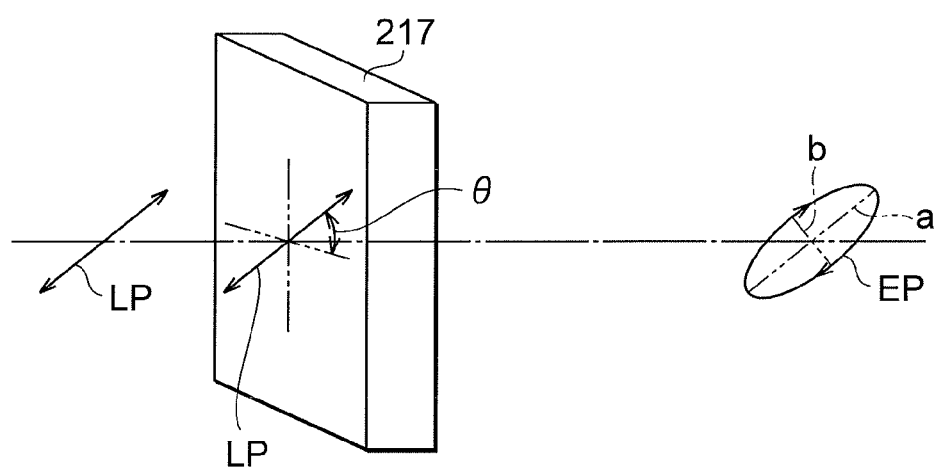
FIG. 26 is a view illustrating the principle of a quarter-wave plate.

When the laser processing device 100 is mounted with a quarter-wave plate 217 such as the one illustrated in FIG. 26, the ellipticity of the elliptically-polarized light can be adjusted by changing the azimuth θ of the quarter-wave plate 217. That is, when a light having linearly-polarized light LP is incident on the quarter-wave plate 217, for example, the light transmitted therethrough attains elliptically-polarized light EP with a predetermined ellipticity ((half the length b of the minor axis)/(half the length a of the major axis) in the ellipse representing the elliptically-polarized light). When irradiating the silicon substrate 11 with the laser light L having the linearly-polarized light LP, the laser light L emitted from the laser light source 101 has the linearly-polarized light LP, whereby it will be sufficient if the azimuth θ is adjusted such that the laser light L passes through the quarter-wave plate 217 while keeping the linearly-polarized light LP.

INDUSTRIAL APPLICABILITY

The present invention can accurately form spaces having various shapes in a silicon substrate.

REFERENCE SIGNS LIST 7, 7a, 7b, 7c, 7d, 7e . . . modified region; 11 . . . silicon substrate; 12, 12a, 12b, 12c, 12d, 12e . . . fine; 13 . . . through hole (space); L . . . laser light; S . . . modified spot

The invention claimed is:

1. A substrate processing method for forming a space extending along a cutting line in a silicon substrate, the method comprising:
   a first step of converging a laser light which is an elliptically-polarized light having an ellipticity other than 1 at the silicon substrate so as to form a plurality of modified spots within the silicon substrate along the cutting line and cause a modified region including the plurality of modified spots; and
   a second step of anisotropically etching the silicon substrate after the first step so as to advance an etching selectively along the modified region and form the space in the silicon substrate;
   wherein, in the first step, the laser light is converged at the silicon substrate in a first mode when forming the plurality of modified spots align in a plurality of rows along the cutting line, and in a second mode when forming the plurality of modified spots align in a single row along the cutting line,
   wherein in the first mode, an angle between a moving direction of the laser light with respect to the silicon substrate and a direction of polarization of the laser light is less than 45°, and in the second mode, an angle between a moving direction of the laser light with respect to the silicon substrate and a direction of polarization of the laser light is more than 45°.

2. A substrate processing method according to claim 1, wherein, in the first step, the plurality of modified spots are formed to align in a plurality of rows along the cutting line when seen in a predetermined direction perpendicular to an incident direction of the laser light with respect to the silicon substrate.

3. A substrate processing method according to claim 1, wherein, in the first step, the plurality of modified spots are formed to align in a plurality of rows along the cutting line when seen in an incident direction of the laser light with respect to the silicon substrate.

4. A substrate processing method according to claim 1, wherein, in the first step, the laser light is converged at the silicon substrate such that the moving direction of the laser light and the direction of polarization of the laser light form an angle of 0° therebetween.

5. A substrate processing method according to claim 1, wherein the elliptically-polarized light is a linearly-polarized light having an ellipticity of 0.

6. A substrate processing method according to claim 1, wherein the space is a through hole opening to front and rear faces of the silicon substrate.

7. A substrate processing method for forming a space extending along a cutting line in a silicon substrate, the method comprising:
- a first step of converging an elliptically-polarized laser light having an ellipticity other than 1 at the silicon substrate and moving the laser light so as to form a plurality of modified spots align in a plurality of rows along the cutting line within the silicon substrate and cause a modified region including the plurality of modified spots, such that an angle between a moving direction of the laser light with respect to the silicon substrate and a direction of polarization of the laser light is less than 45°;
- a second step of converging the elliptically-polarized laser light at the silicon substrate and moving the laser light so as to form the plurality of modified spots align in a single row along the cutting line within the silicon substrate and cause the modified region including the plurality of modified spots, such that an angle between a moving direction of the laser light with respect to the silicon substrate and a direction of polarization of the laser light is more than 45'; and
- a third step of anisotropically etching the silicon substrate after the first step so as to advance an etching selectively along the modified region and form the space in the silicon substrate.

\* \* \* \* \*